(12) United States Patent
Lin et al.

(10) Patent No.: US 12,463,113 B2
(45) Date of Patent: Nov. 4, 2025

(54) MEMORY STRUCTURE HAVING NOVEL CIRCUIT ROUTING AND METHOD FOR MANUFACTURING THE SAME

(71) Applicant: TAIWAN SEMICONDUCTOR MANUFACTURING COMPANY, LTD., Hsinchu (TW)

(72) Inventors: Meng-Han Lin, Hsinchu (TW); Chia-En Huang, Hsinchu (TW); Yi-Ching Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 785 days.

(21) Appl. No.: 17/583,415

(22) Filed: Jan. 25, 2022

(65) Prior Publication Data

US 2023/0238303 A1   Jul. 27, 2023

(51) Int. Cl.
| | | |
|---|---|---|
| H01L 23/48 | (2006.01) | |
| H01L 21/48 | (2006.01) | |
| H01L 21/70 | (2006.01) | |
| H01L 23/522 | (2006.01) | |
| H01L 23/528 | (2006.01) | |
| H10B 41/10 | (2023.01) | |
| H10B 41/27 | (2023.01) | |
| H10B 43/10 | (2023.01) | |
| H10B 43/27 | (2023.01) | |

(52) U.S. Cl.
CPC .......... *H01L 23/481* (2013.01); *H01L 21/486* (2013.01); *H01L 21/70* (2013.01); *H01L 23/5226* (2013.01); *H01L 23/5283* (2013.01); *H10B 41/10* (2023.02); *H10B 41/27* (2023.02); *H10B 43/10* (2023.02); *H10B 43/27* (2023.02)

(58) Field of Classification Search
CPC ..... H01L 23/481; H01L 21/486; H01L 21/70; H01L 23/5226; H01L 23/5283; H10B 41/10; H10B 43/10; H10B 43/40; H10B 53/20; H10B 51/20; H10B 41/20–27; H10B 43/20–27; H10B 63/84–845; H10B 20/40–65
See application file for complete search history.

(56) References Cited

U.S. PATENT DOCUMENTS

| | | | | |
|---|---|---|---|---|
| 10,727,243 B1 * | 7/2020 | Lue | ........................ | H10B 41/40 |
| 10,896,918 B1 * | 1/2021 | Oh | ........................ | H10B 43/50 |
| 2021/0091108 A1 * | 3/2021 | Naruke | .................. | G11C 16/24 |

(Continued)

*Primary Examiner* — Cuong B Nguyen
(74) *Attorney, Agent, or Firm* — Birch, Stewart, Kolasch & Birch, LLP

(57) ABSTRACT

A semiconductor device includes a substrate, an active structure, a memory structure, and a first conductive line. The active structure is disposed on the substrate. The memory structure is disposed over the active structure, and has a lower surface and an upper surface opposite to each other. The memory structure includes a deep via disposed in the memory structure, and extends in an upward direction from the lower surface to terminate at the upper surface. The first conductive line is disposed above the upper surface of the memory structure, and extends in a first lengthwise direction transverse to the upward direction. The first conductive line is electrically connected to the active structure through the deep via. A method for manufacturing the semiconductor device is also disclosed.

20 Claims, 31 Drawing Sheets

(56) References Cited

U.S. PATENT DOCUMENTS

2022/0336358 A1* 10/2022 Oh .................... H01L 21/76829
2023/0206976 A1*  6/2023 Lee .................... G11C 11/2255
                                                         257/316

* cited by examiner

MEMORY STRUCTURE HAVING NOVEL CIRCUIT ROUTING AND METHOD FOR MANUFACTURING THE SAME

BACKGROUND

Semiconductor memory structures are widely used in computers, portable devices, automotive parts, and internet of things (IoT), etc. With increasing requirement of the semiconductor memory structures to have a high memory capacity, in addition to scale down memory cells, a memory array tends to be developed to have a three-dimensional (3D) architecture instead of a two-dimensional (2D) architecture, so that the memory capacity of the semiconductor memory structures can be effectively increased with a relatively small area penalty.

A complementary metal oxide semiconductor (CMOS) device with a back-end-of-line (BEOL) compatible 3D memory structure is a next-generation technology which incorporates the excellent performance of the CMOS device and the high-density memory stacking in the BEOL. However, a memory array with a 3D architecture has a relatively complicated circuit, and it is relatively difficult to connect the 3D memory structure to the circuit of the CMOS device. Hence, there is demand to develop a 3D semiconductor memory structure with a novel source line/bit line (SL/BL) routing to integrate the CMOS device and the 3D memory structure with a monolithic CMOS process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
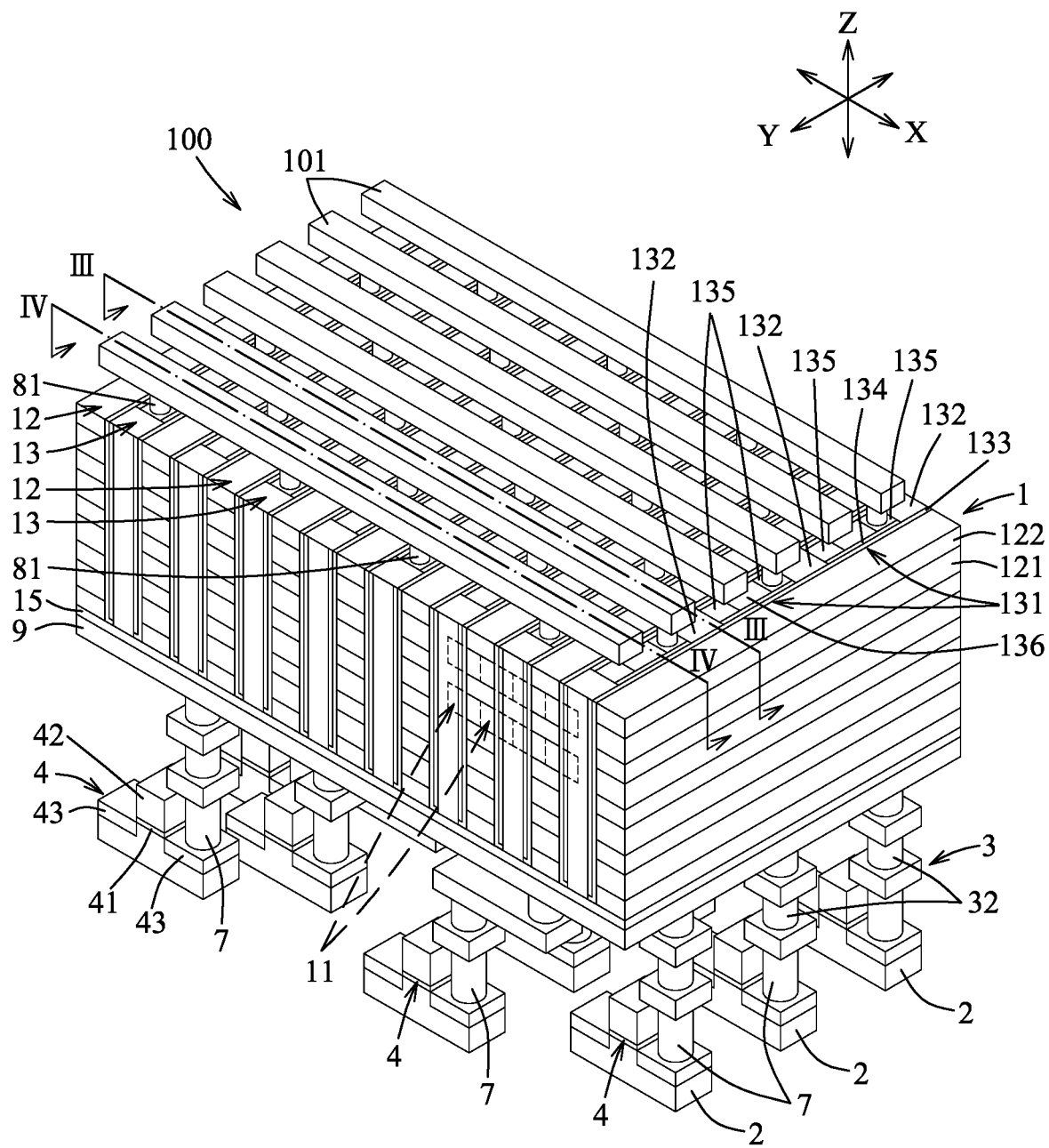
FIG. 1 is a schematic perspective view of a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
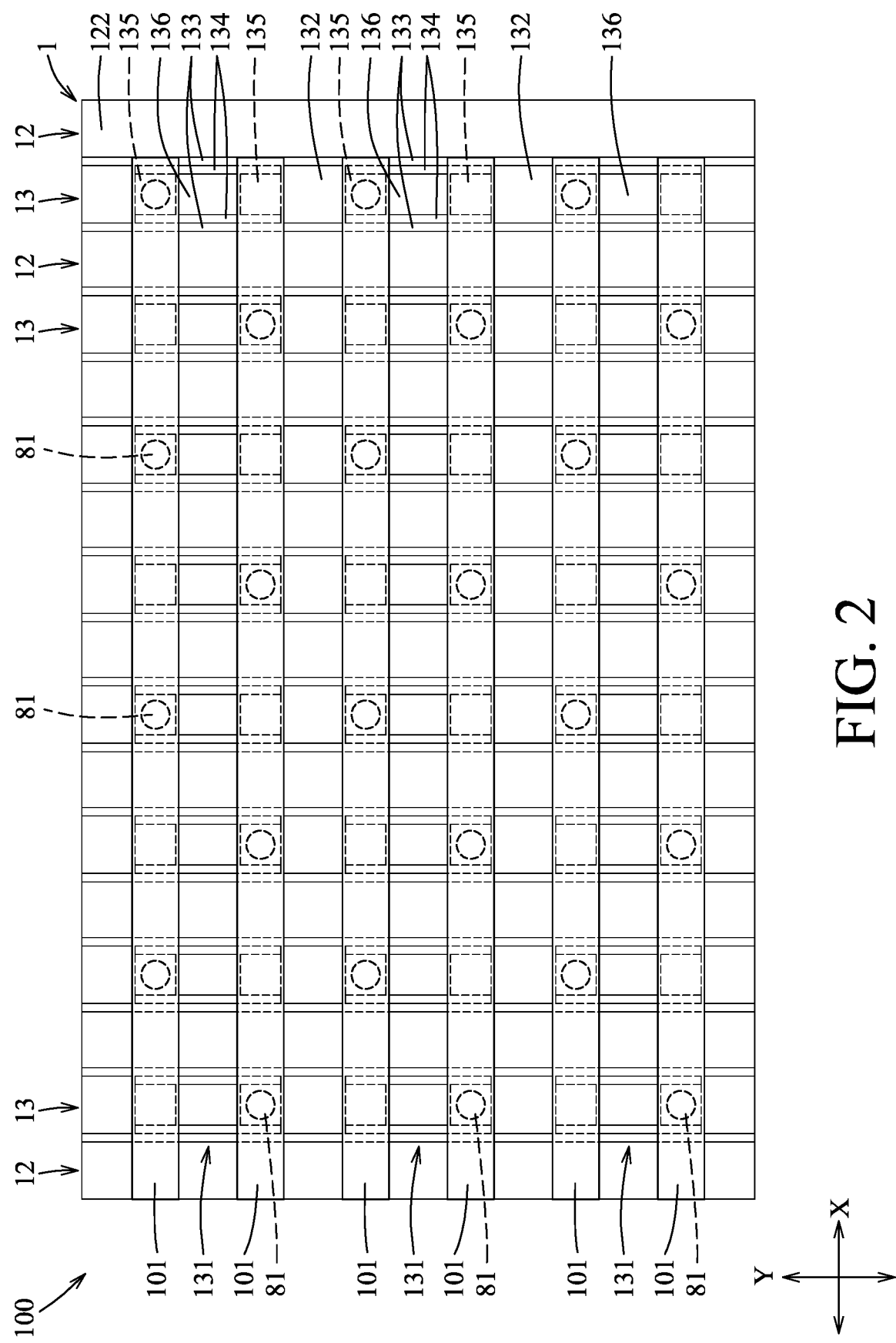
FIG. 2 is a top view of the semiconductor device as depicted in FIG. 1 in accordance with some embodiments.
Figure 3:
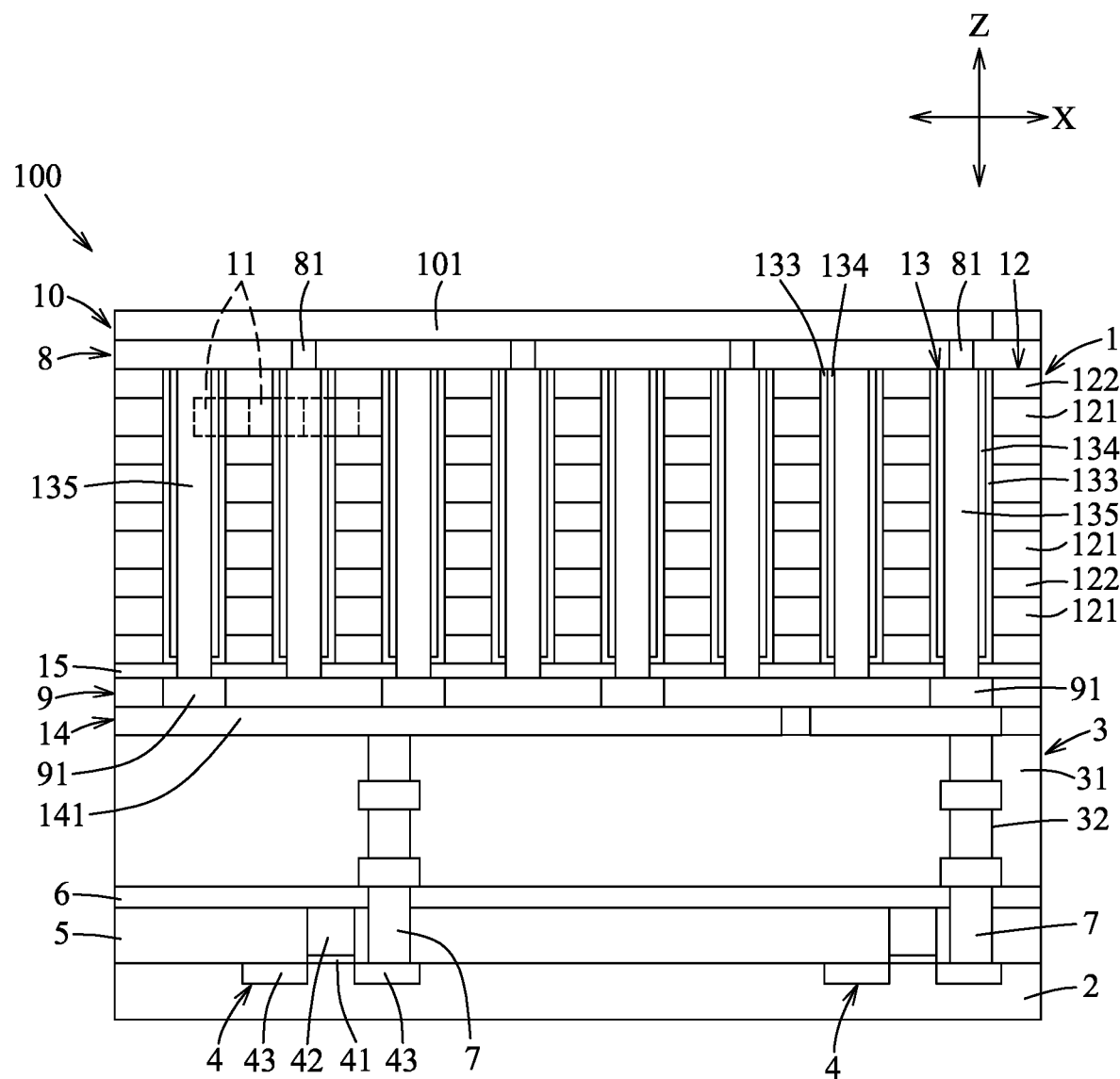
FIG. 3 is a schematic sectional view of the semiconductor device taken along line of FIG. 1.
Figure 4:
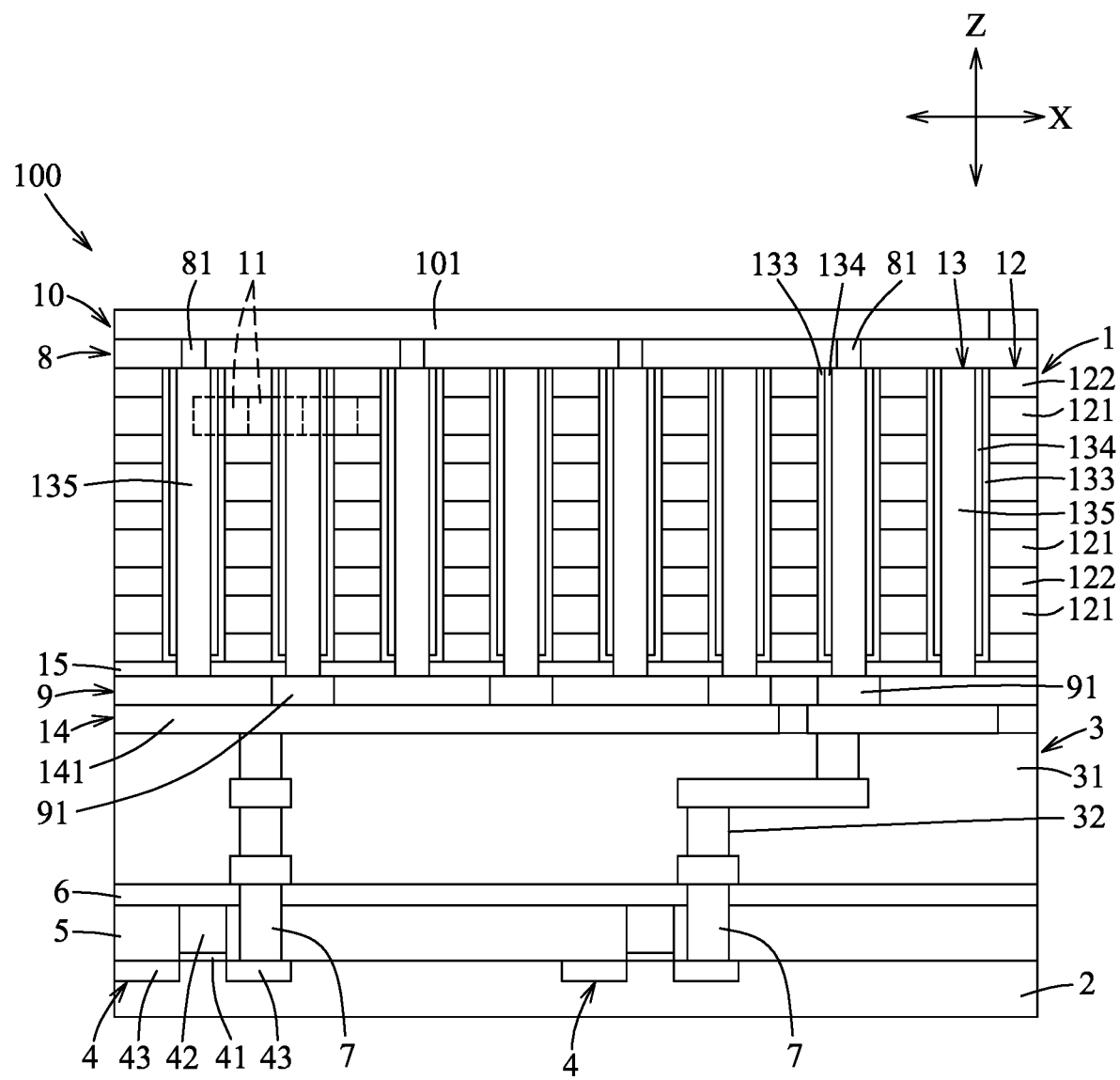
FIG. 4 is another schematic sectional view of the semiconductor device taken along line IV-IV of FIG. 1.

The present disclosure is directed to a semiconductor device and a method for manufacturing the same. FIG. 1 is a schematic perspective view of a semiconductor device 100 in accordance with some embodiments. FIG. 2 is a top view of the semiconductor device 100 as depicted in FIG. 1 in accordance with some embodiments. FIG. 3 is a schematic sectional view of the semiconductor device 100 taken along line of FIG. 1. FIG. 4 is another schematic sectional view of the semiconductor device 100 taken along line IV-IV of FIG. 1. The semiconductor device 100 includes a three-dimensional (3D) memory structure 1, which includes a plurality of thin film transistors (TFTs) 11 arranged in three directions (for example, X, Y, and Z directions) which are transverse to one another. In some embodiments, the three directions are perpendicular to one another. In some embodiments, the 3D memory structure 1 is located in the back-end of line (BEOL), while in certain embodiments, the 3D memory structure 1 may be located in the front-end of line (FEOL). In some embodiments, the 3D memory structure 1 may be, for example, a 3D NOR flash device. Other suitable memory devices are within the contemplated scope of the disclosure.

The 3D memory structure 1 includes a plurality of stack units 12 and a plurality of features 13 disposed to alternate with the stack units 12 in the X direction.

The stack units 12 are separated from one another. In some embodiments, the stack units 12 are displaced from one another in the X direction, and are each elongated in the Y direction. Each of the stack units 12 includes a plurality of conductive films 121 and a plurality of dielectric films 122.

The dielectric films 122 are disposed to alternate with the conductive films 121 such that the dielectric films 122 and the conductive films 121 are stacked in the Z direction. Each of the conductive films 121 and the dielectric films 122 is elongated in the Y direction. In some embodiments, each of the conductive films 121 has two conductive regions (not shown) which are separated from each other in the X direction, and a glue portion (not shown) sandwiched by the two conductive regions to bond the two conductive regions together.

Each of the features 13 includes a plurality of repeating units 131 and a plurality of separators 132 which are disposed to alternate with the repeating units 131 in the Y direction. In certain embodiments, each of the repeating units 131 includes two memory portions 133, two channel portions 134, a pair of conductive pillars 135, and an isolation portion 136. Each of the memory portions 133 is in contact with the conductive films 121 of a respective one of the stack units 12. The two channel portions 134 are disposed respectively on the two memory portions 133. Each of a pair of the conductive pillars 135 is in contact with the two channel portions 134. The isolation portion 136 is disposed between the channel portions 134 to separate a pair of the conductive pillars 135 from each other. The conductive pillars 135 extend in an upward direction (i.e., the Z direction) from a lower surface of the 3D memory structure 1 to terminate at an upper surface of the 3D memory structure 1.

As the 3D memory structure 1 includes a plurality of the TFTs 11, each of the conductive films 121 serves as a word line, and one and the other one of a pair of the conductive pillars 135 serve as a bit line and a source line, respectively. The word line has a plurality of word line portions which are displaced from one another in the Y direction. Each of the word line portions serves as a gate electrode of a corresponding one of the TFTs 11. The source line has a plurality of source line portions which are displaced from one another in the Z direction, and each of the source line portions serves as a first source/drain electrode of a corresponding one of the TFTs 11. The bit line has a plurality of bit line portions which are displaced from one another in the Z direction, and each of the bit line portions serves as a second source/drain electrode of a corresponding one of the TFTs 11. Each of the channel portions 134 includes a plurality of channel regions which are displaced from one another in the Z direction. Each of the channel regions is located among a corresponding one of the word line portions (i.e., the gate electrode), a corresponding one of the source line portions (i.e., the first source/drain electrode) and a corresponding one of the bit line portions (i.e., the second source/drain electrode), and serves as a channel of a corresponding one of the TFTs 11. Each of the memory portions 133 has a plurality of memory regions which are displaced from one another in the Z direction, and each of the memory regions serves as a gate dielectric to electrically isolate a corresponding one of the word line portions from a corresponding one of the channel regions in a corresponding one of the TFTs 11.

Therefore, each of the TFTs 11 includes a gate electrode (i.e., the word line portion), a first source/drain electrode (i.e., the source line portion), a second source/drain electrode (i.e., the bit line portion), a channel (i.e., the channel region), and a gate dielectric (i.e., the memory region). As shown in FIG. 1, two adjacent TFTs 11 formed at two opposite sides of a word line portion and at the same X-Y plane can share the same word line portion. In addition, two adjacent TFTs 11 formed at two opposite sides of the source line portion (and the bit line portion) and at the same X-Y plane can share the same source line portion (and the bit line portion).

The semiconductor device 100 further includes a substrate 2, circuits formed over the substrate 2, and an interconnect layer 3.

In some embodiments, the substrate 2 may include a semiconductor substrate. The semiconductor substrate may be, for example, but not limited to, a silicon-on-insulator (SOI) substrate, a germanium-on-insulator (GOI) substrate, a bulk semiconductor substrate, or the like, and may be doped with a dopant. The substrate 2 may have multiple layers. The substrate 2 may include elemental semiconductor materials, such as crystalline silicon, diamond, or germanium; compound semiconductor materials, such as silicon carbide, gallium arsenic, indium arsenide, gallium phosphide, indium arsenide, indium phosphide, or indium antimonide; alloy semiconductor materials, such as silicon germanium, silicon germanium carbide, gallium arsenic phosphide, aluminum gallium arsenide, or gallium indium phosphide; or combinations thereof. Other materials suitable for the substrate 2 are within the contemplated scope of the disclosure.

The circuits include active structures 4 (for example, but not limited to, transistors) disposed on the substrate 2. Each of the transistors includes a gate dielectric layer 41 disposed on the substrate 2, a gate electrode 42 disposed on the gate dielectric layer 41, and a pair of source/drain regions 43 disposed on the substrate 2 and at opposite sides of the gate dielectric layer 41 and the gate electrode 42. In some embodiments, the transistors may be planar field effect transistors (FETs), fin field effect transistors (finFETs), nano-field effect transistors (nanoFETs), or the like.

A first interlayer dielectric (ILD) layer 5 is disposed on the substrate 2 and the source/drain regions 43 to surround and isolate the gate dielectric layers 41 and the gate electrodes 42. A second ILD layer 6 is disposed on the first ILD layer 5. A plurality of source/drain contacts 7 extend through the second ILD layer 6 and the first ILD layer 5, and are electrically connected to the source/drain regions 43, respectively. The interconnect layer 3 is disposed on the second ILD layer 6, and includes one or more stacked dielectric layers 31 and a plurality of interconnect structures 32 formed in the one or more stacked dielectric layers 31. The gate electrode 42 of each of the transistors may be electrically connected to a corresponding one of the interconnect structures 32 through a corresponding one of gate contacts (not shown) disposed on the gate electrodes 42. The interconnect structures 32 may be electrically connected to the gate contacts and the source/drain contacts 7 to form functional circuits. In some embodiments, the functional circuits may include logic circuits, memory circuits, sense amplifiers, input/output circuits, or the like, or combinations thereof.

The semiconductor device 100 further includes a first inter-metal dielectric (IMD) layer 8, a second IMD layer 9, a first metal layer 10, and a second metal layer 14. The first IMD layer 8 is disposed on the 3D memory structure 1, and is formed with a plurality of first via contacts 81 extending through the first IMD layer 8 in the Z direction. The first metal layer 10 is disposed on the first IMD layer 8 opposite to the 3D memory structure 1, and is formed with a plurality of first conductive lines 101 extending in a first lengthwise direction (i.e., the X direction) and spaced apart from each other in a first spacing direction (i.e., the Y direction). The second IMD layer 9 is disposed below the 3D memory structure 1, and is formed with a plurality of second via contacts 91 extending through the second IMD layer 9 in the Z direction. The second metal layer 14 is disposed below the second IMD layer 9 opposite to the 3D memory structure 1, and is formed with a plurality of second conductive lines 141 extending in a second lengthwise direction (i.e., the X direction) and spaced apart from each other in a second spacing direction (i.e., the Y direction). Although the second lengthwise direction and the second spacing direction are illustrated to be the same as the first lengthwise direction and the first spacing direction, respectively, the second lengthwise direction and the second spacing direction may be transverse to the first lengthwise direction and the first spacing direction, respectively.

Figure 28:
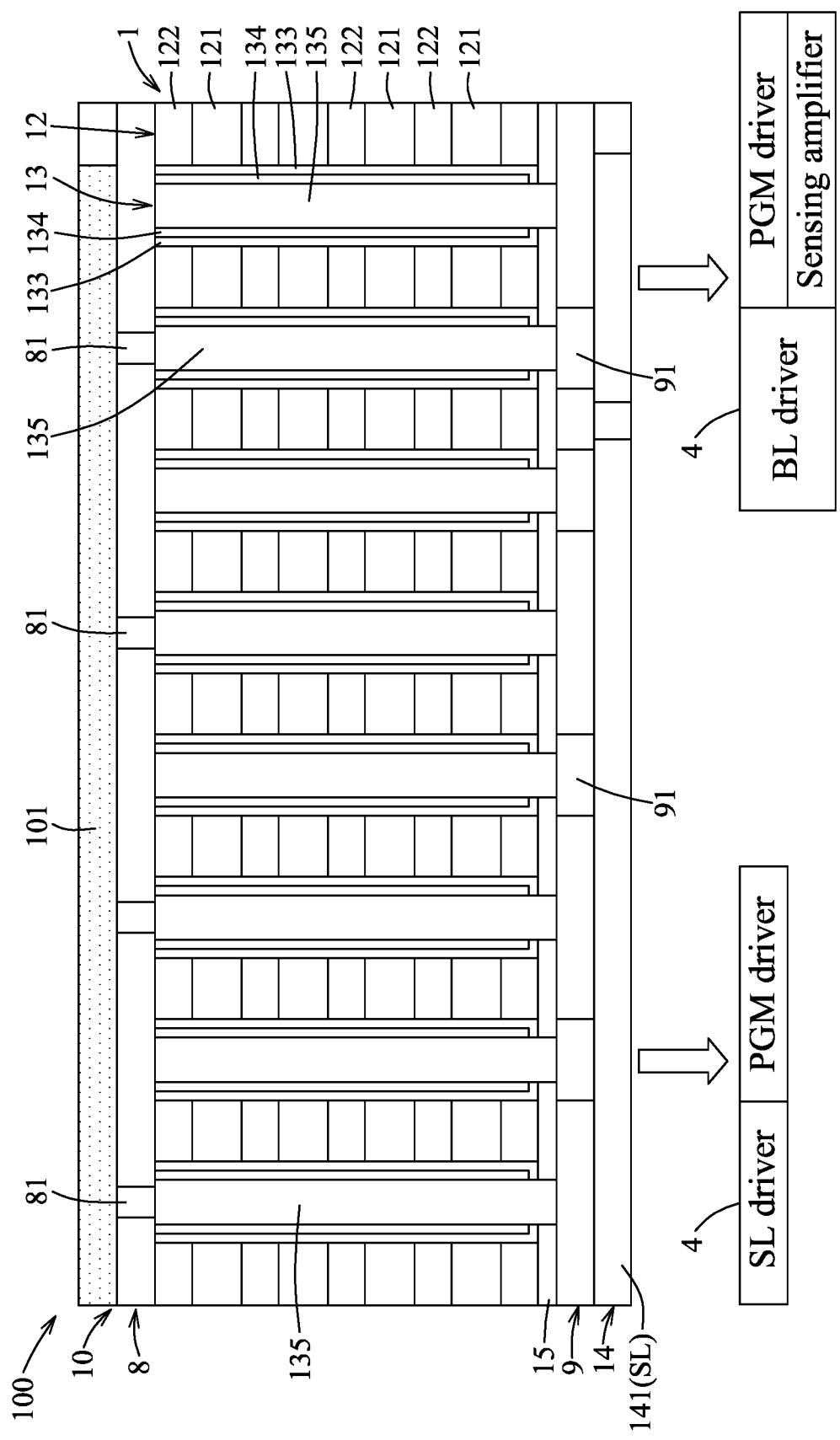
FIG. 28 is a schematic view of a semiconductor device in accordance with some embodiments.

The conductive pillars 135 formed in the 3D memory structure 1 extend in the upright direction (i.e., the Z direction), and are arranged in a plurality of columns spaced apart from each other in the X direction. The conductive pillars 135 in each of the columns are spaced apart from each other in the Y direction. The conductive pillars 135 in each of the columns are aligned with the conductive pillars 151 in an adjacent one of the columns, respectively, in the X direction. A plurality of the conductive pillars 135 serve as deep vias (i.e., dummy source or bit lines) to permit the first conductive lines 101 to be electrically connected to the active structures 4 through the conductive pillars 135 serving as the deep vias, respectively. In some embodiments, all of the first conductive lines 101 serve as global source lines, and each of the global source lines is electrically connected to a corresponding one of the active structures 4 serving as source line drivers through a corresponding one of the first via contacts 81, a corresponding one of the conductive pillars 135 serving as the deep vias, a corresponding one of the second via contacts 91, a corresponding one of the interconnect structures 32, and a corresponding one of the source/drain contacts 7; and all of the second conductive lines 141 serve as global bit lines, and each of the global bit lines is electrically connected to a corresponding one of the active structures 4 serving as bit line drivers through a corresponding one of the interconnect structures 32 and a corresponding one of the source/drain contacts 7. Each of the source line drivers includes a programming driver, and each of the bit line drivers includes a programming driver and a sensing amplifier, as illustrated in FIG. 28.

Figure 32:
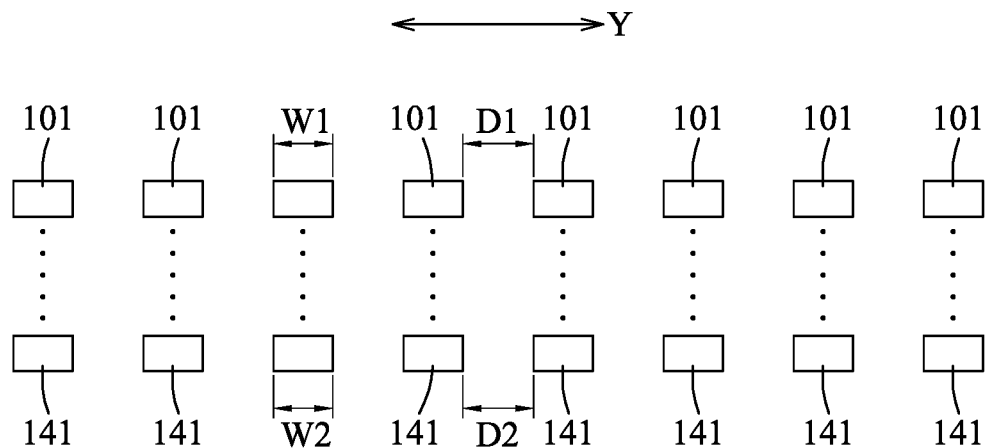
FIGS. 32 and 33 are schematic sectional views illustrating various arrangements of the global source lines and the global bit lines of a semiconductor device in accordance with some embodiments.

Referring to FIG. 32, in some embodiments, the first conductive lines 101 are spaced apart from each other in the first spacing direction (i.e., the Y direction) by a same first distance (D1), and have a same first width (W1) in the first spacing direction. The second conductive lines 141 are spaced apart from each other in the second spacing direction (i.e., the Y direction) by a same second distance (D2), and have a same second width (W2) in the second spacing direction. In some embodiments, the first distance (D1) is the same as the second distance (D2), and the first width (W1) is the same as the second width (W2).

Figure 5:
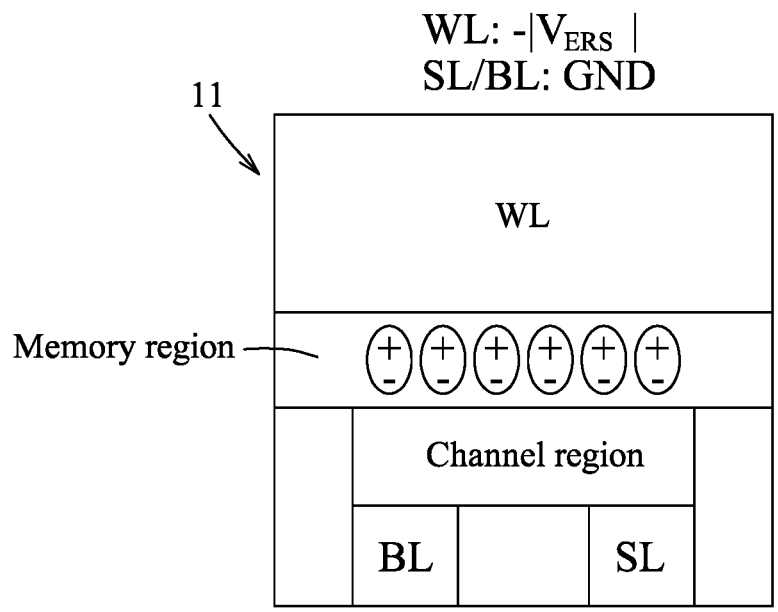
FIGS. 5 and 6 are schematic views illustrating two different polarization states of a memory cell.
Figure 6:
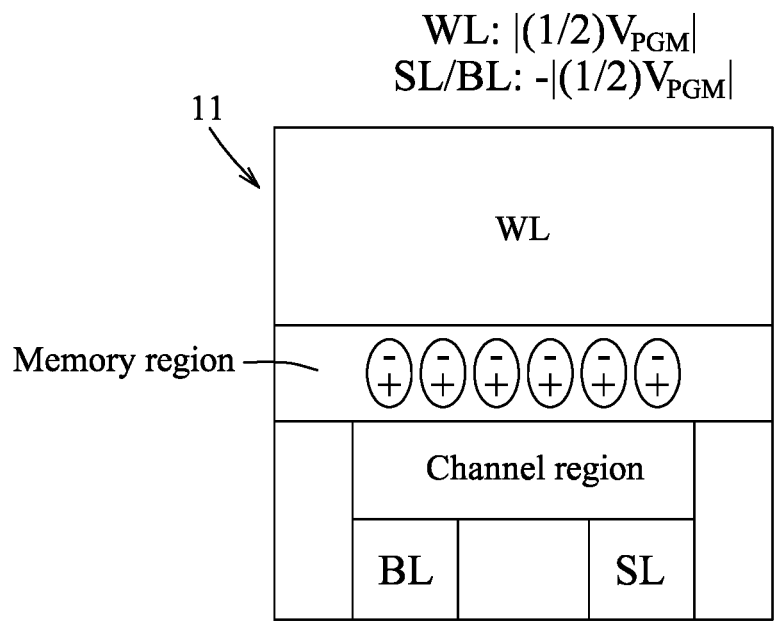

FIGS. 5 and 6 are schematic views illustrating two different polarization states of a memory cell (i.e., TFT 11). During a writing operation, a memory region of each of the TFTs 11 can be switched to one of a first polarization state and a second polarization state by applying suitable voltages to a corresponding word line, and a corresponding source line and a corresponding bit line of a corresponding repeating unit 131. In some embodiments, when the word line is applied with a voltage of $-|V_{ERS}|$ ($V_{ERS}$ indicating an erase voltage), and the source line and the bit line are grounded, the TFT 11 is switched to the first polarization state as illustrated in FIG. 5. When the word line is applied with a voltage of $|(\frac{1}{2})V_{PGM}|$ ($V_{PGM}$ indicating a programming voltage), and the source line and the bit line are applied with a voltage of $-|(\frac{1}{2})V_{PGM}|$, the TFT 11 is switched to the second polarization state as illustrated in FIG. 6. Because each of the source line and the bit line is charged to a negative voltage for a programming process, each of the source line and the bit line requires a programming driver, as illustrated in FIG. 28.

Each of the TFTs 11 has different threshold voltages at the first and second polarization states, thereby storing different digital values (e.g., 0 or 1) in each of the TFTs 11. For example, each of the TFTs 11 has a relatively low threshold voltage (low VT) at the first polarization state and a relatively high threshold voltage (high VT) at the second polarization state. The polarization state of the memory region can be detected by measuring a current passing through a channel region of the TFT 11 after application of a suitable reading voltage. It should be noted that the reading voltage has a value between the low VT and the high VT, and will not change the polarization state of the memory region of the TFT 11. For example, a higher current will be detected when the memory region is at the first polarization state, and a lower current will be detected when the memory region is at the second polarization state.

Figure 7A:
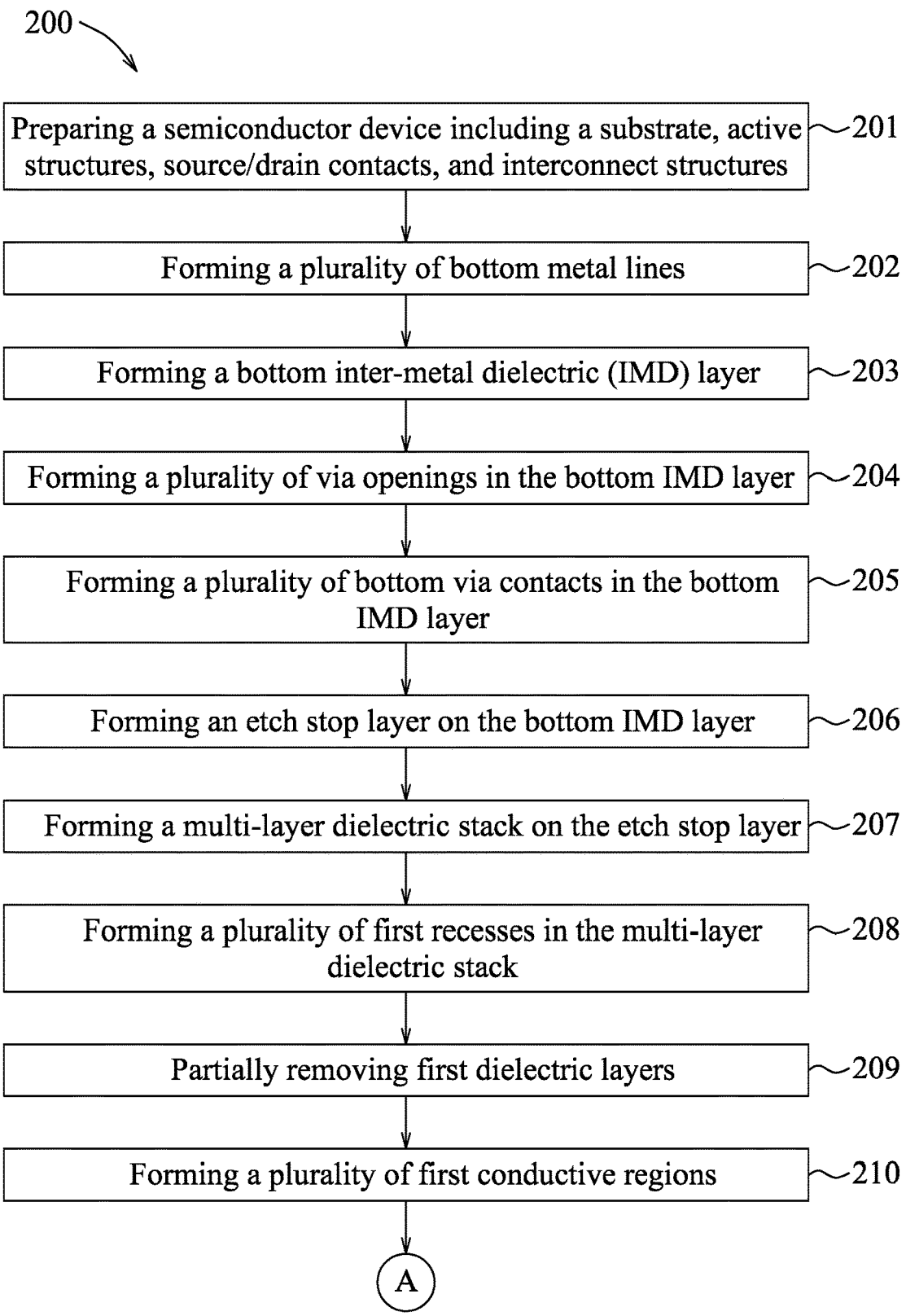
FIGS. 7A and 7B show a flow diagram illustrating a method for manufacturing a semiconductor device in accordance with some embodiments.
Figure 7B:
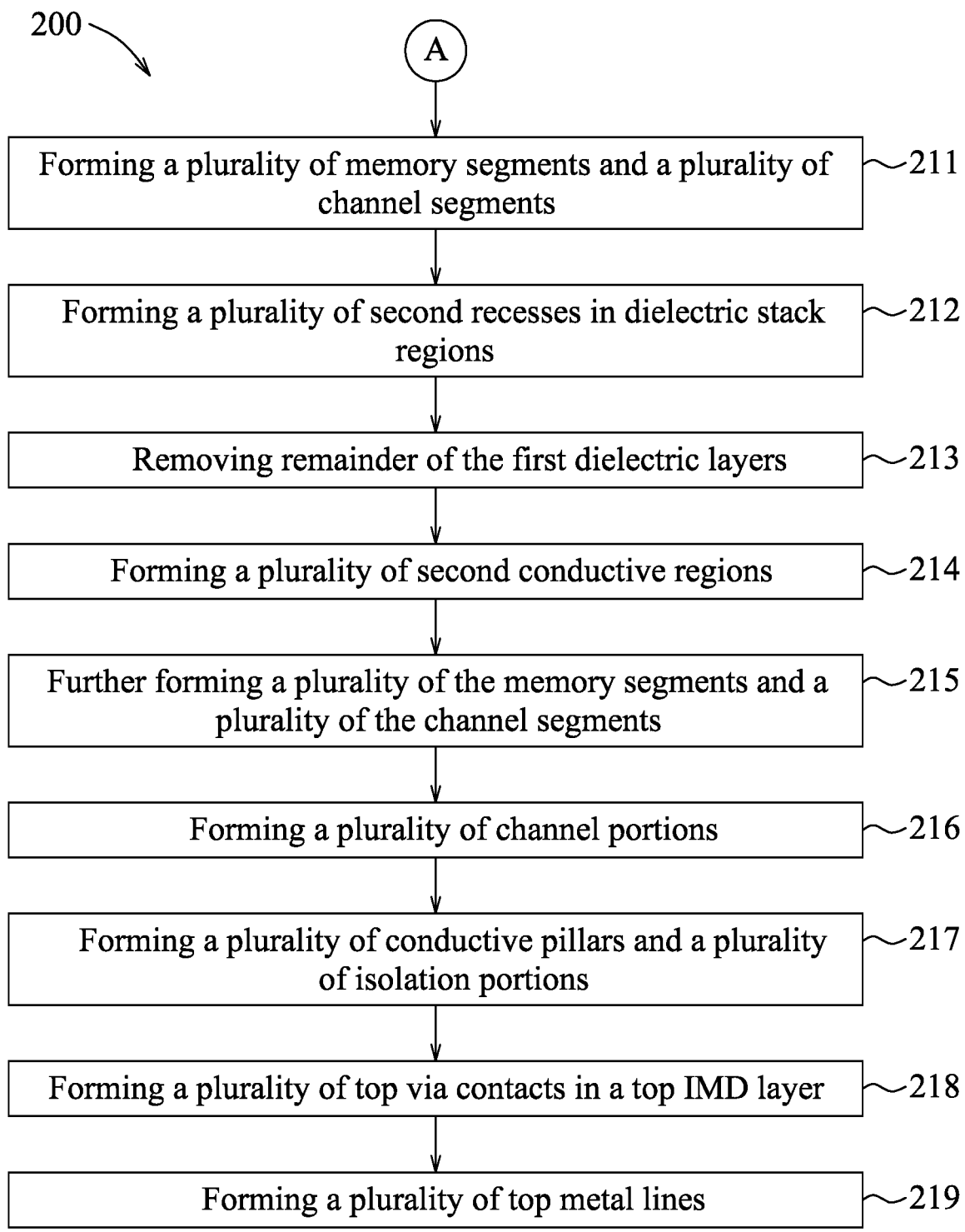

FIGS. 7A and 7B show a flow diagram illustrating a method 200 for manufacturing a semiconductor device in accordance with some embodiments. FIGS. 8 to 26 illustrate schematic perspective views of a semiconductor device 100 during various stages of the method 200 shown in FIGS. 7A and 7B. The method 200 and the semiconductor device 100 are collectively described below. However, additional steps can be provided before, after or during the various stages of the method 200, and some of the steps described herein may be replaced by other steps or be eliminated. Similarly, further additional features may be present in the semiconductor device 100, and/or the features present may be replaced or eliminated in additional embodiments.

Figure 8:
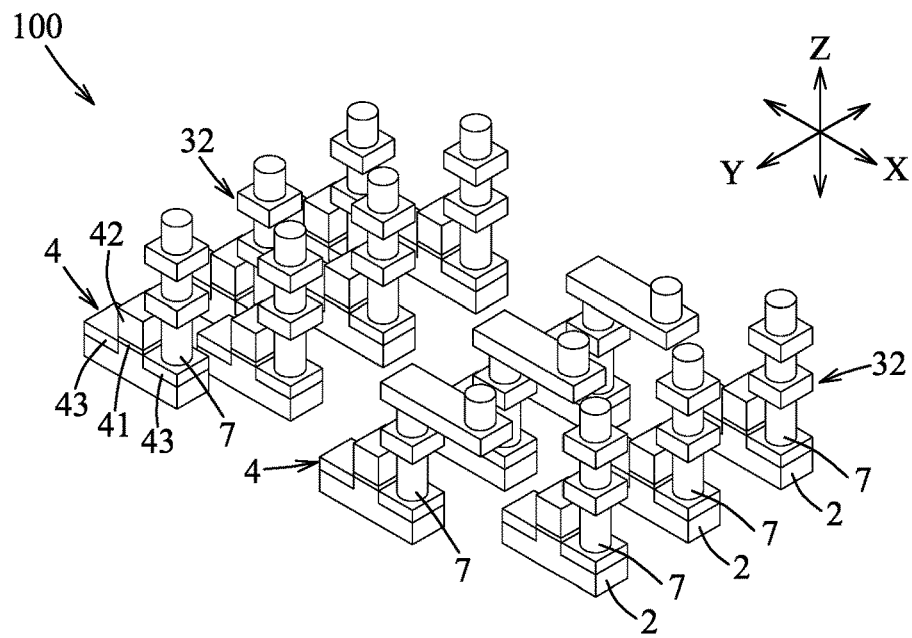
FIGS. 8 to 26 are schematic perspective views illustrating intermediate stages of the manufacturing method as depicted in FIGS. 7A and 7B in accordance with some embodiments.
Figure 9:
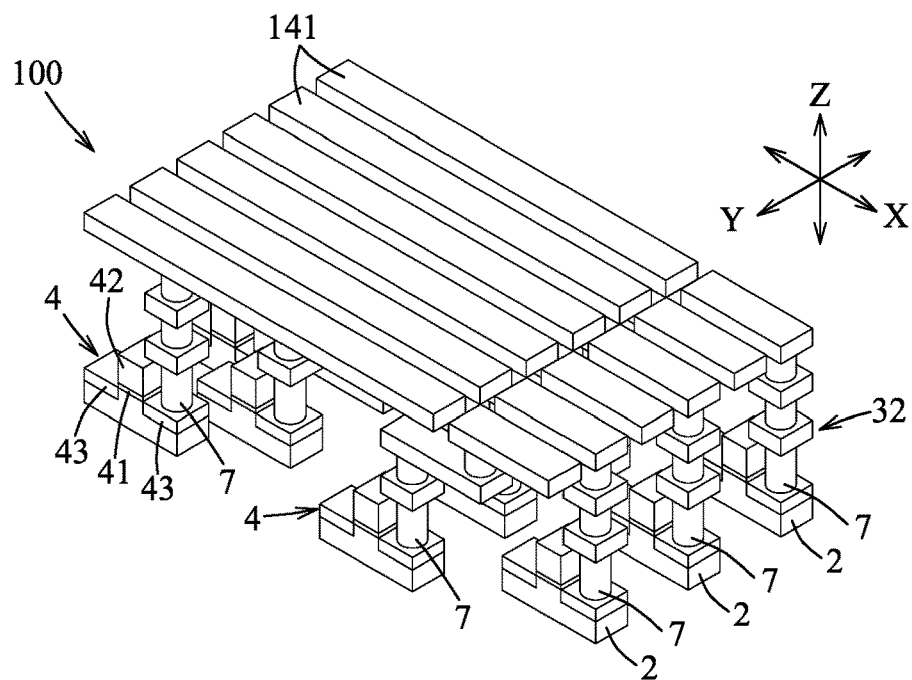
Figure 10:
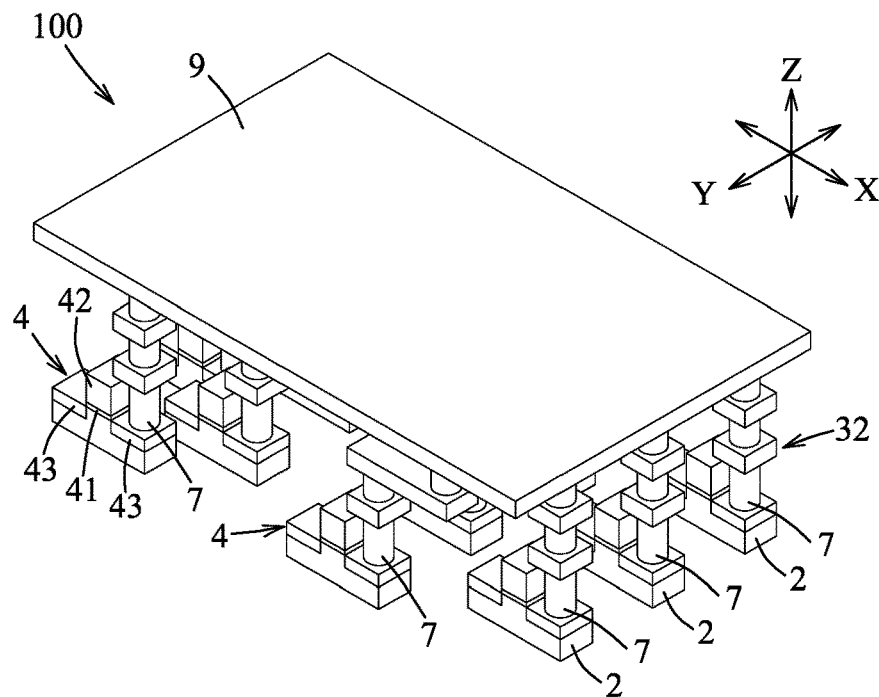
Figure 11:
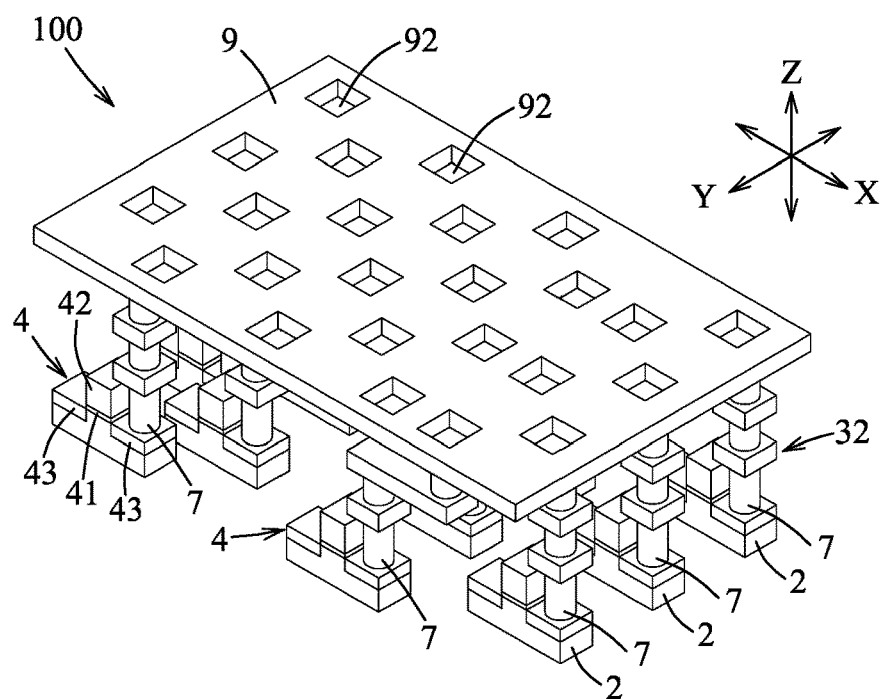
Figure 12:
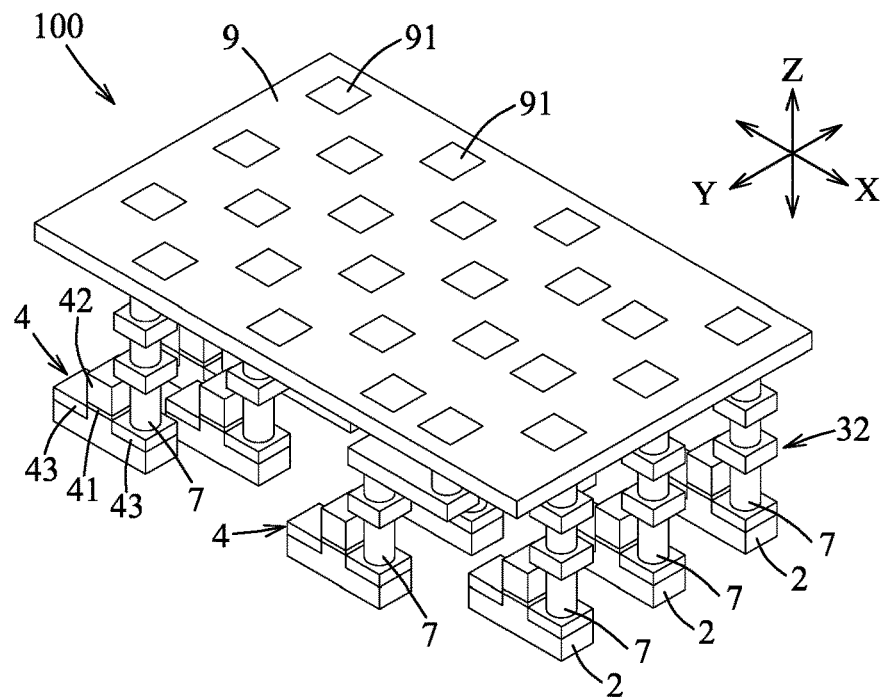
Figure 13:
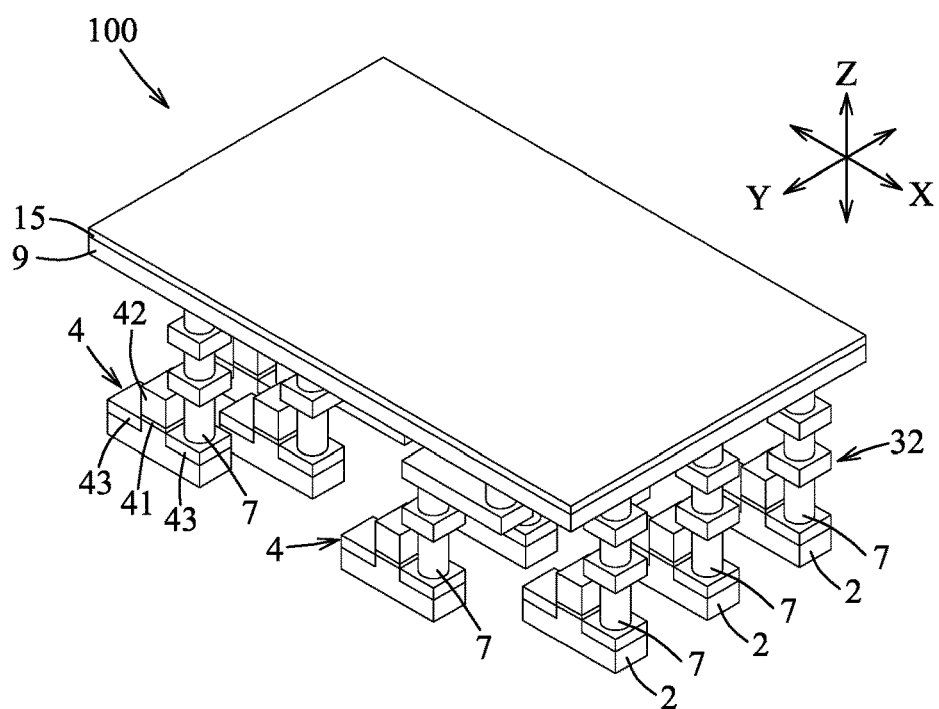
Figure 14:
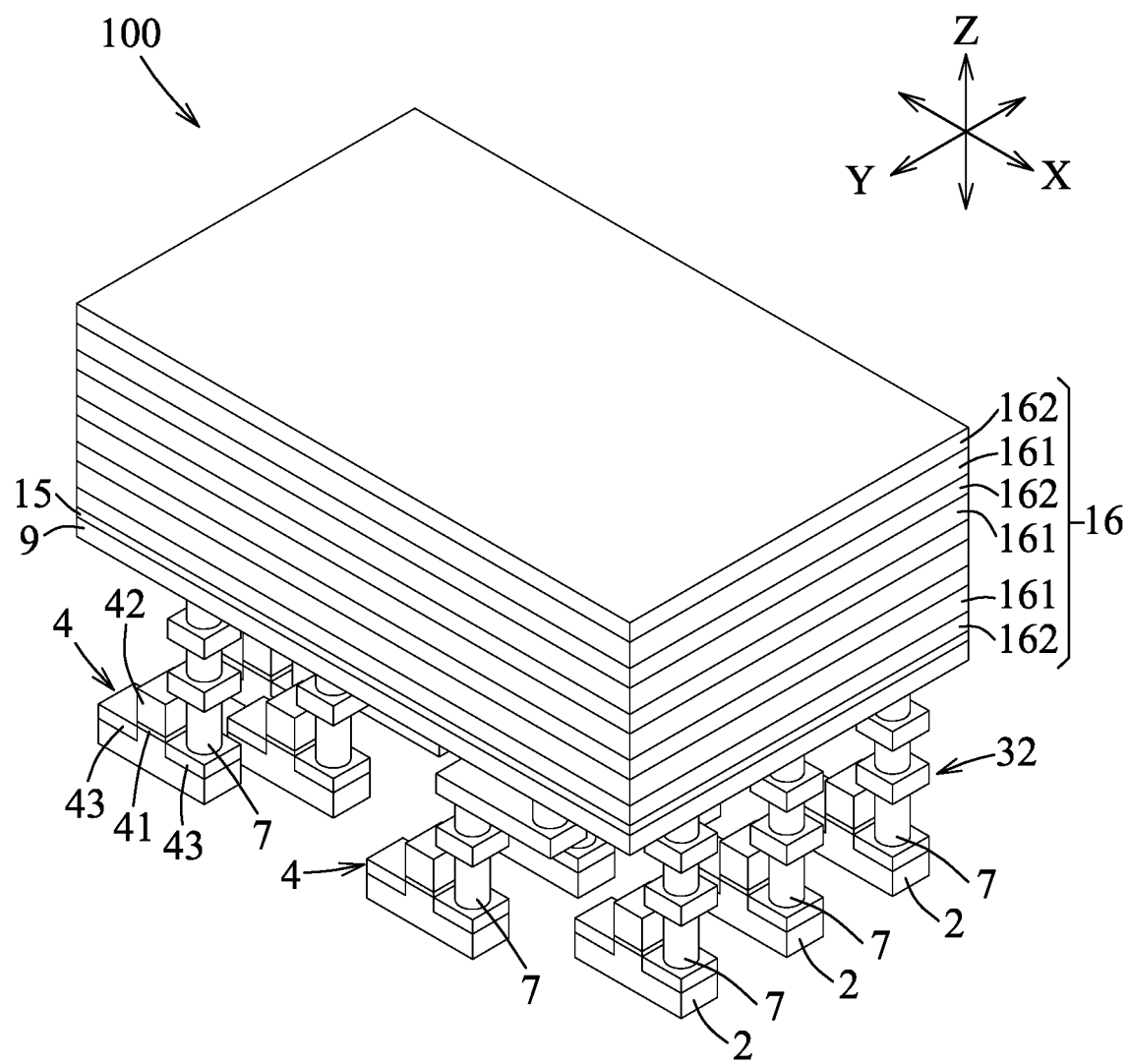
Figure 15:
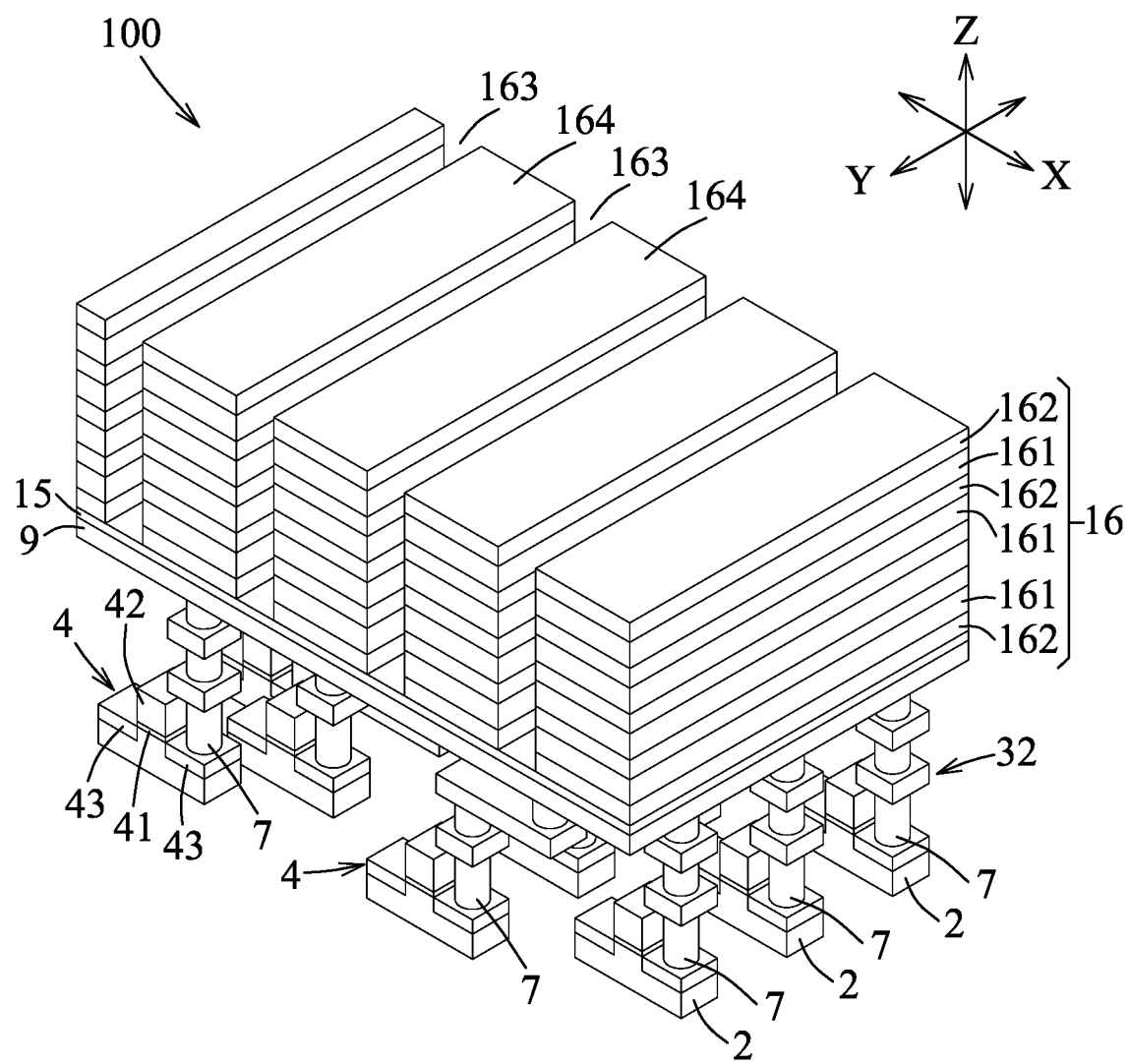
Figure 16:
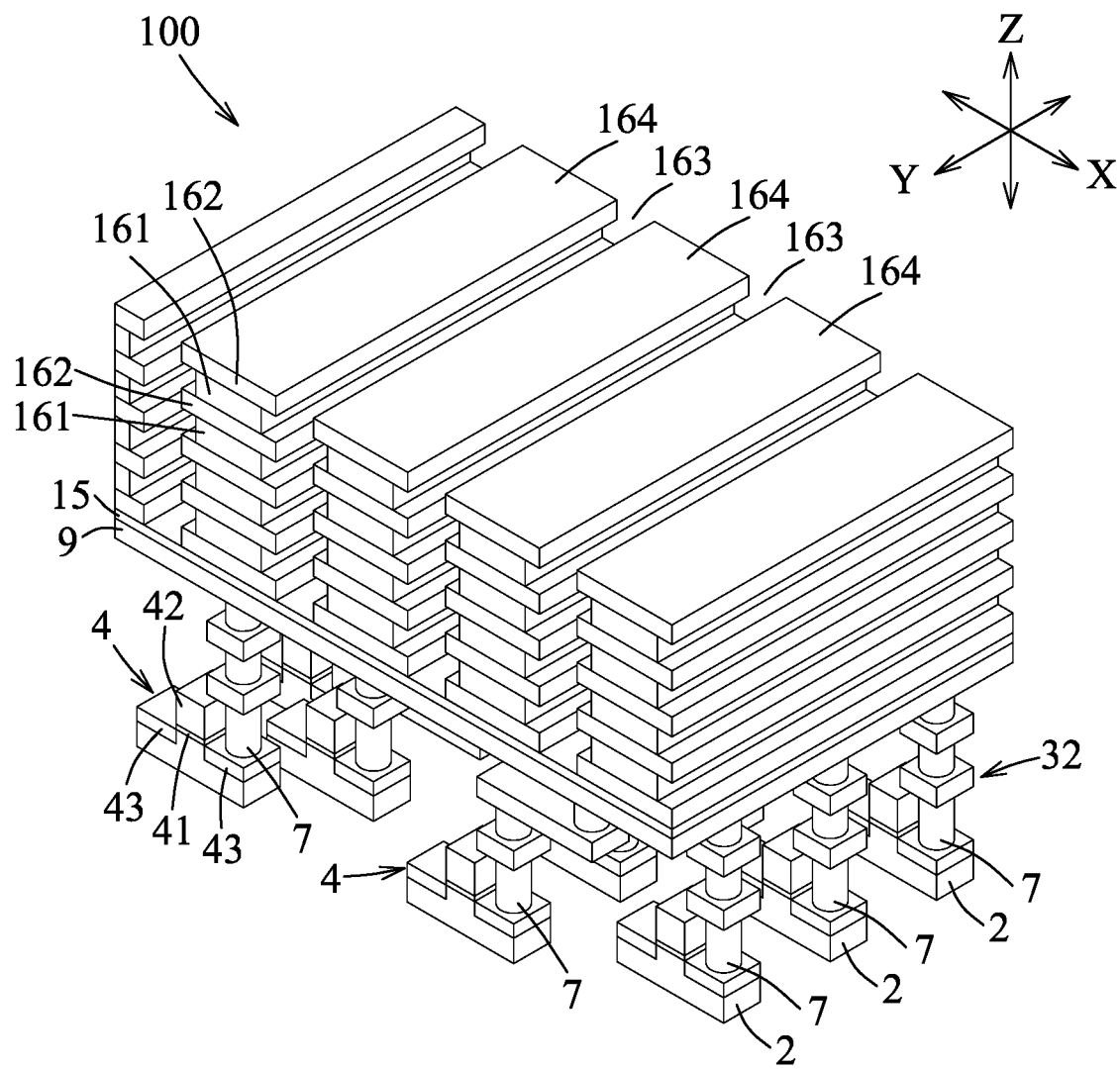
Figure 17:
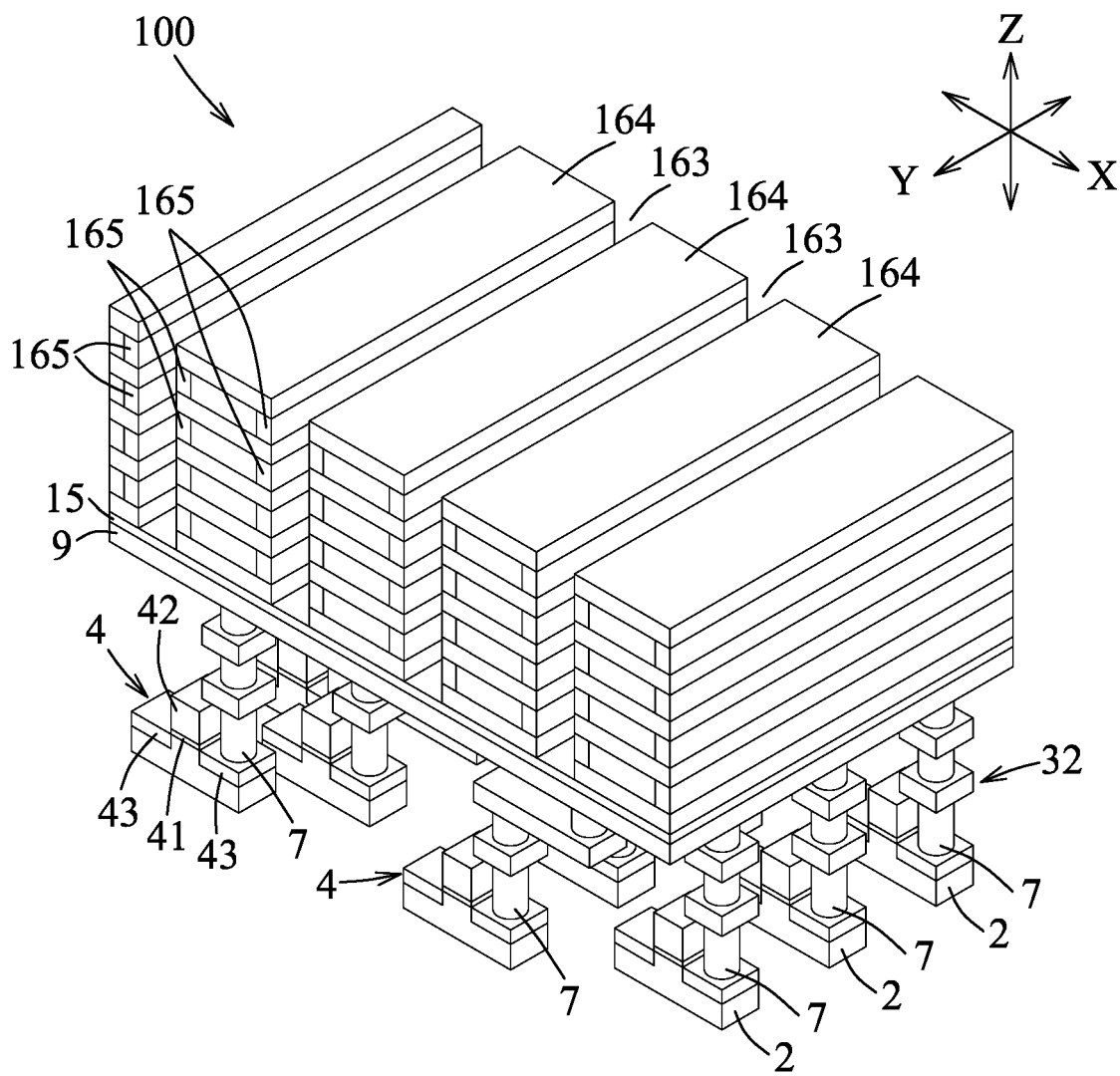
Figure 18:
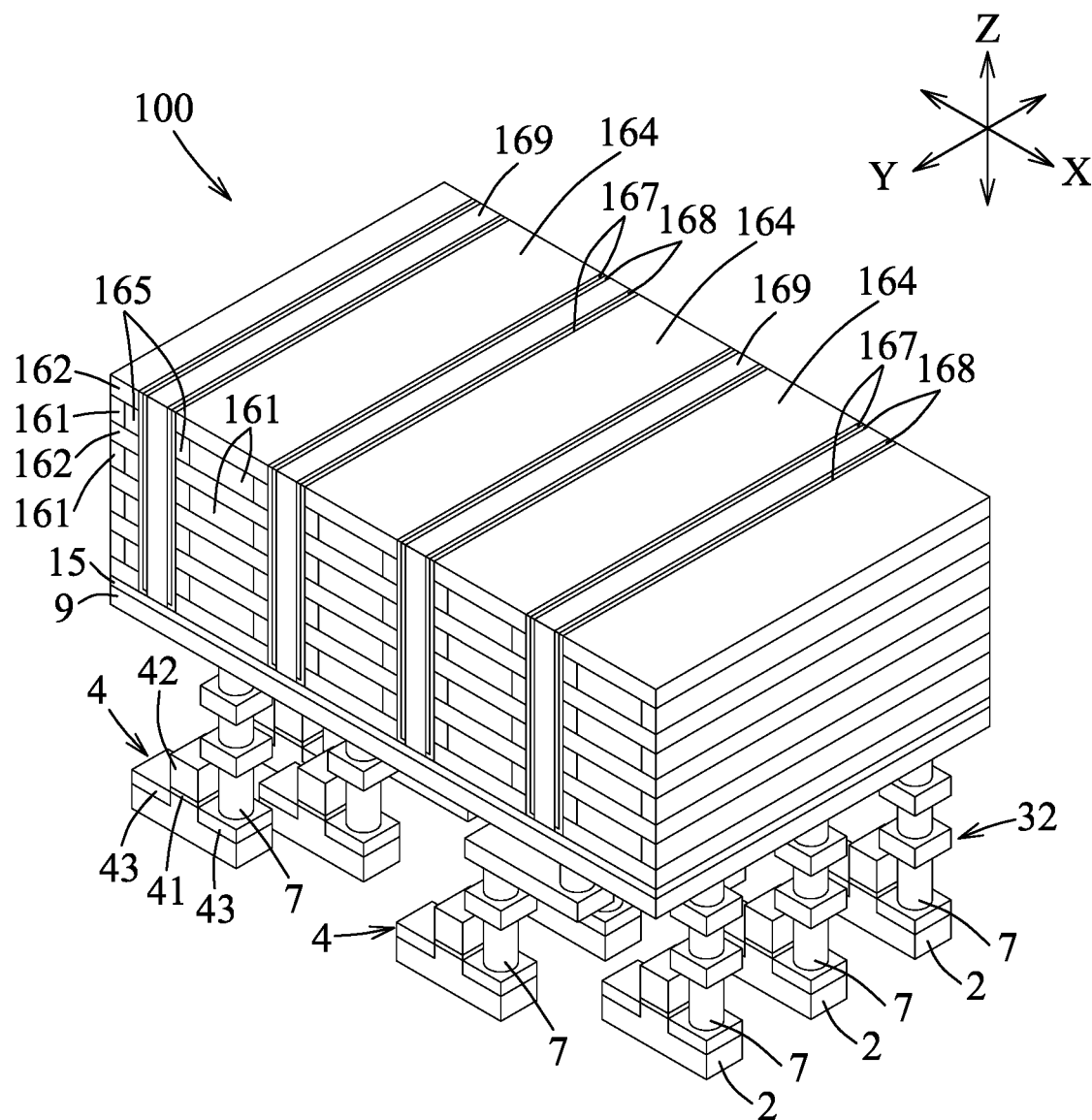
Figure 19:
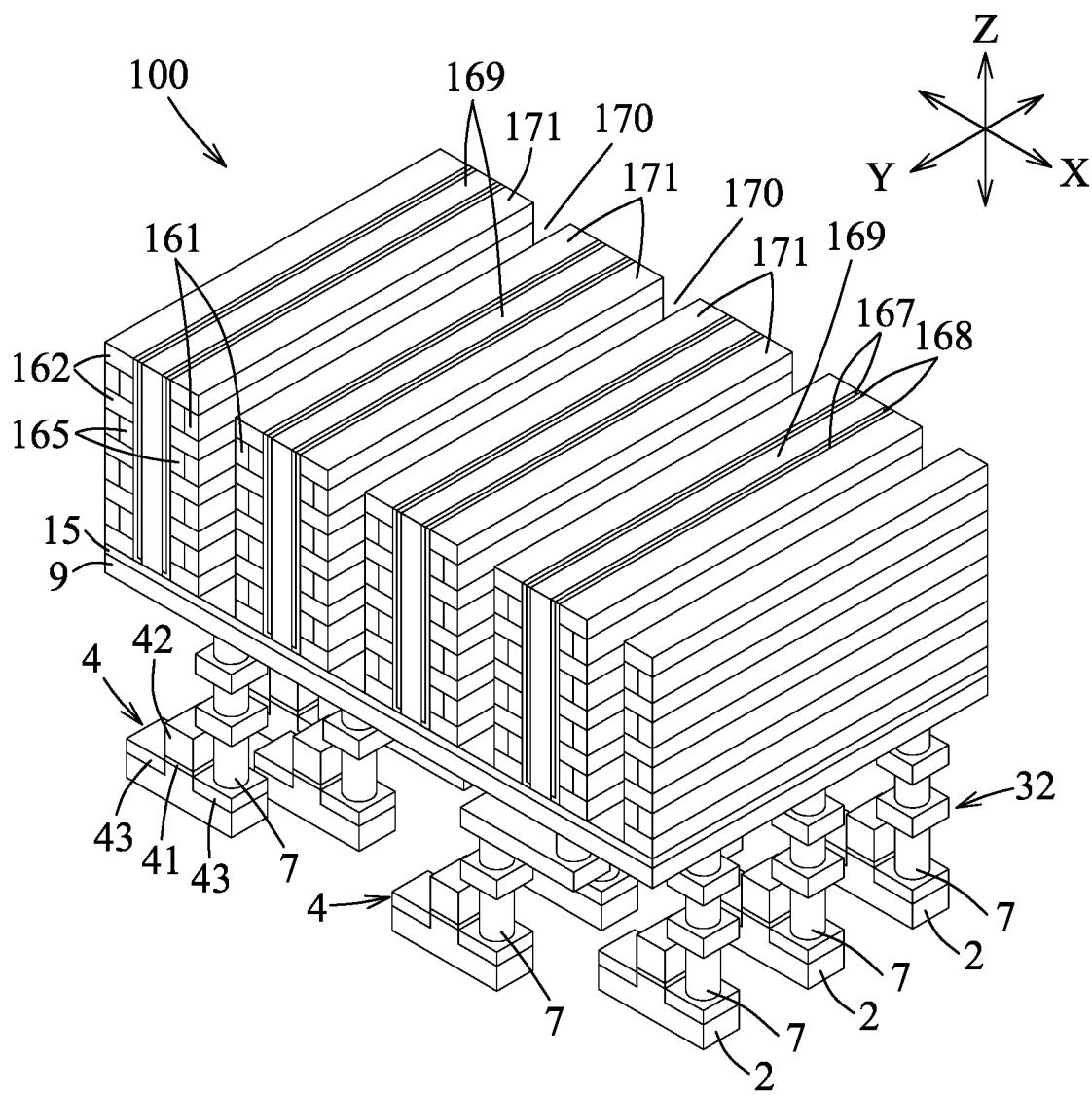
Figure 20:
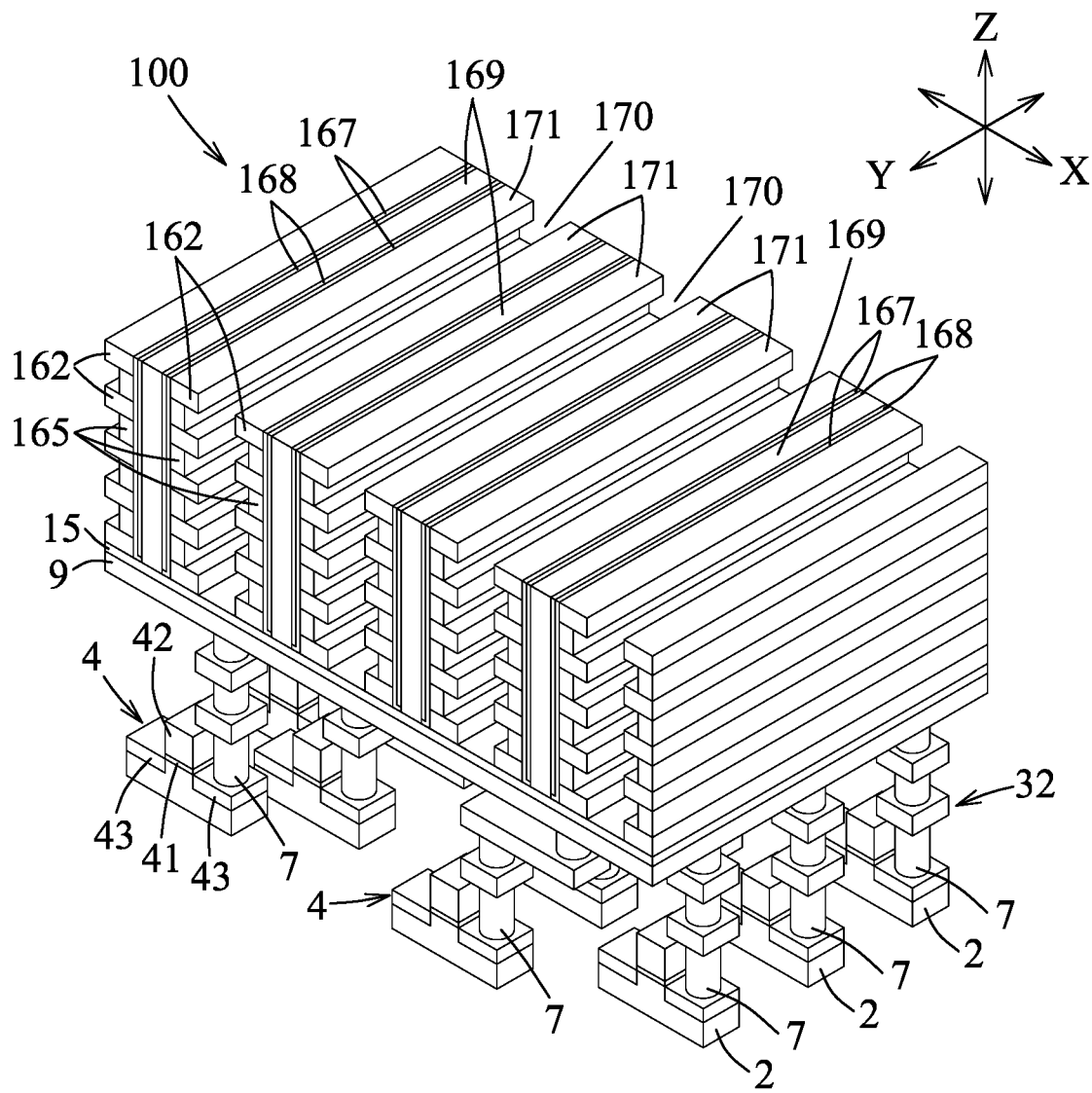
Figure 21:
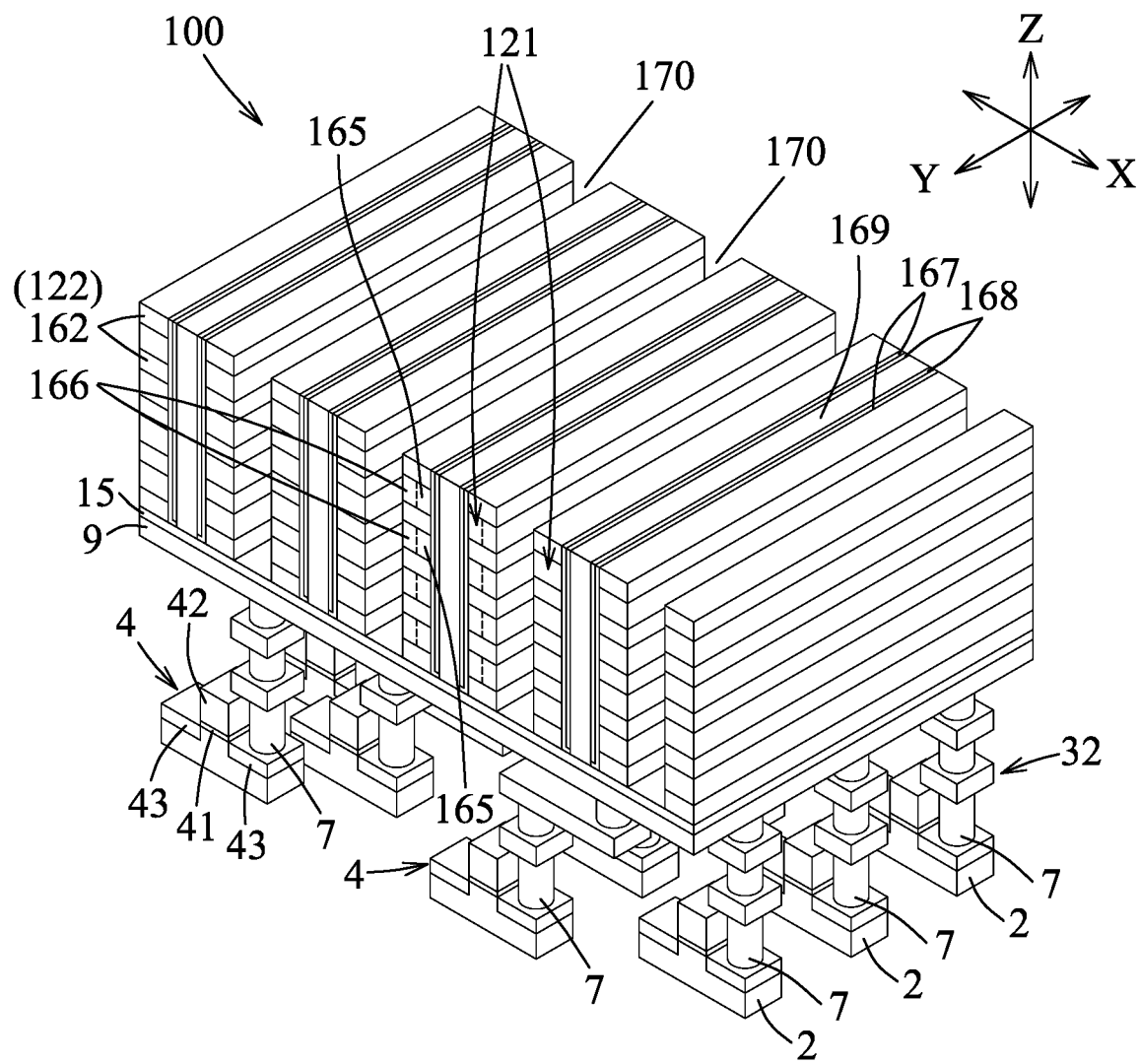

Referring to FIG. 7A, the method 200 begins at block 201, where a semiconductor device is prepared. Referring to the examples illustrated in FIGS. 3 and 8, the semiconductor device 100 having a configuration shown in FIG. 8 is prepared to include the substrate 2; the active structures 4 (for example, but not limited to, transistors) disposed on the substrate 2; the source/drain contacts 7, each of which is disposed on a corresponding one of the source/drain regions 43 of a corresponding one of the active structures 4; and the interconnect structures 32, each of which is disposed on a corresponding one of the source/drain contacts 7.

Referring to FIG. 7A, the method 200 then proceeds to block 202, where a plurality of bottom metal lines are formed. Referring to the examples illustrated in FIGS. 3 and 9, a plurality of bottom metal lines (i.e., the second conductive lines 141) are formed in the second metal layer 14. In some embodiments, formation of the second conductive lines 141 includes the following steps. First, an interlayer dielectric (ILD) layer is deposited on the interconnect layer 3, and then a plurality of recesses are formed through the ILD layer to expose the corresponding ones of the interconnect structures 32 from the recesses. After formation of the recesses, the second conductive lines 141 are formed by depositing a metal material to fill the recesses and then removing excess of the metal material above the ILD layer by a planarization technique, such as chemical mechanical planarization (CMP). In some embodiments, the metal material may include, for example, but not limited to, Ru, Co, Mo, W, Ni, Ir, Rh, Os, and the like, or combinations thereof. In some embodiments, deposition of the metal material may be conducted by a suitable fabrication technique known to those skilled in the art of semiconductor fabrication, for example, but not limited to, chemical vapor deposition (CVD), plasma-enhanced CVD (PECVD), atomic layer deposition (ALD), plasma-enhanced ALD (PEALD), or other suitable deposition techniques.

Referring to FIG. 7A, the method 200 then proceeds to block 203, where a bottom inter-metal dielectric layer is formed. Referring to the examples illustrated in FIGS. 3 and 10, a bottom inter-metal dielectric (IMD) layer (i.e., the second IMD layer 9) is formed over the second metal layer 14 by a suitable fabrication technique known to those skilled in the art of semiconductor fabrication, such as CVD, PECVD, or the like. Other suitable fabrication techniques for forming the second IMD layer 9 are within the contemplated scope of the disclosure. The second IMD layer 9 may be made of, for example, but not limited to, boro-silicate glass (BSG), boron-doped phospho-silicate glass (BPSG), phospho-silicate glass (PSG), undoped silicate glass (USG), or the like. Other suitable materials for the second IMD layer 9 are within the contemplated scope of the disclosure.

Referring to FIG. 7A, the method 200 then proceeds to block 204, where a plurality of via openings are formed in the bottom IMD layer. Referring to the example illustrated in FIG. 11, a plurality of via openings 92 are formed in the second IMD layer 9. In some embodiments, formation of the via openings 92 includes the following steps. First, a hard mask is formed on the second IMD layer 9 by a suitable fabrication technique known to those skilled in the art of semiconductor fabrication, for example, but not limited to, CVD, physical vapor deposition (PVD), ALD, PECVD, or the like. A photoresist layer is then formed on the hard mask by a suitable fabrication technique known to those skilled in the art of semiconductor fabrication, for example, but not limited to, a spin-on technique. The photoresist layer is then patterned using a suitable photolithography technique to form a pattern of recesses arranged in position corresponding to the via openings 92 to be formed. For example, the photoresist layer is exposed to light for patterning, followed by developing to form the pattern of the recesses. The pattern of the recesses formed in the photoresist layer is transferred to the hard mask using a suitable etching process, for example, but not limited to, a wet etching process, a dry etching process, a reactive ion etching process, a neutral beam etching process, or the like. After the pattern of the recesses is transferred to the hard mask, the photoresist layer may be removed by, for example, but not limited to, an ashing process. The pattern of the recesses formed in the hard mask is then transferred to the second IMD layer 9 using a suitable etching process, for example, but not limited to, a wet etching process, a dry etching process, a reactive ion etching process, a neutral beam etching process, or the like, so as to form the via openings 92 extending through the second IMD layer 9. Thereafter, the hard mask may be removed by a suitable process, for example, but not limited to, a wet etching process, a dry etching process, a planarization process, or the like.

Referring to FIG. 7A, the method 200 then proceeds to block 205, where a plurality of bottom via contacts are formed in the bottom IMD layer. Referring to the example illustrated in FIGS. 3, 11, and 12, a plurality of bottom via contacts (i.e., the second via contacts 91) are formed in the bottom IMD layer (i.e., the second IMD layer 9) by depositing a metal material to fill the via openings 92 and then removing excess of the metal material above the second IMD layer 9 by a planarization technique, such as CMP. The metal material and the deposition process for forming the second via contacts 91 are the same as or similar to those for forming the second conductive lines 141 described above with reference to FIG. 9, and thus details thereof are omitted for the sake of brevity.

Referring to FIG. 7A, the method 200 then proceeds to block 206, where an etch stop layer is formed on the bottom IMD layer. Referring to the examples illustrated in FIGS. 3 and 13, an etch stop layer 15 is formed on the second IMD layer 9 by a suitable fabrication technique known to those skilled in the art of semiconductor fabrication, for example, but not limited to, CVD, PVD, ALD, PECVD, or the like. In some embodiments, the etch stop layer 15 may be made of a dielectric material, for example, but not limited to, silicon nitride, silicon nitride doped with carbon, silicon oxide, silicon oxynitride, silicon oxynitride doped with carbon, amorphous carbon material, silicon carbide, other nitride materials, other carbide materials, aluminum oxide, other oxide materials, other metal oxides, boron nitride, boron carbide, and other low-k dielectric materials or low-k dielectric materials doped with one or more of carbon, nitrogen, and hydrogen, or other suitable materials.

Referring to FIG. 7A, the method 200 then proceeds to block 207, where a multi-layer dielectric stack is formed on the etch stop layer. Referring to the example illustrated in FIG. 14, a multi-layer dielectric stack 16 is formed on the etch stop layer 15. The multi-layer dielectric stack 16 includes a plurality of first dielectric layers 161 and a plurality of second dielectric layers 162, which are alternately stacked on the etch stop layer 15. In some embodiments, the first dielectric layers 161 may include, for example, but not limited to, SiN, and the second dielectric layers 162 may include, for example, but not limited to, silicon oxide (SiO2).

Referring to FIG. 7A, the method 200 then proceeds to block 208, where a plurality of first recesses are formed in the multi-layer dielectric stack. Referring to the example illustrated in FIG. 15, the multi-layer dielectric stack 16 is recessed by an anisotropic etching process to form a plurality of first recesses 163 and a plurality of dielectric stack regions 164. Adjacent two of the dielectric stack regions 164 are spaced apart from each other in the X direction by a corresponding one of the first recesses 163. The anisotropic etching process may be a suitable anisotropic etching process, for example, but not limited to, anisotropic dry etching.

Referring to FIG. 7A, the method 200 then proceeds to block 209, where the first dielectric layers are partially removed. Referring to the example illustrated in FIG. 16, the first dielectric layers 161 are laterally recessed by an isotropic etching process to remove side portions of the first dielectric layers 161 based on a relatively high etching selectivity of the first dielectric layers 161 with respect to the second dielectric layers 162.

Referring to FIG. 7A, the method 200 then proceeds to block 210, where a plurality of first conductive regions are formed. Referring to the examples illustrated in FIGS. 16 and 17, a conductive material is filled in the first recesses 163, and then a planarization (for example, but not limited to, CMP) is conducted to remove excess of the conductive material above the dielectric stack regions 164, followed by etching back the conductive material filled in the first recesses 163 by an anisotropic etching process to form a plurality of first conductive regions 165. In some embodiments, a glue layer (not shown) may be conformally deposited on the dielectric stack regions 164 before the conductive material is filled in the first recesses 163. In some embodiments, the glue layer may be made of, for example, but not limited to, titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), or the like, or combinations thereof. Other suitable materials for the glue layer are within the contemplated scope of the disclosure.

Referring to FIG. 7B, the method 200 then proceeds to block 211, where a plurality of memory segments and a plurality of channel segments are formed. Referring to the examples illustrated in FIGS. 17 and 18, a memory layer and a channel layer are conformally deposited sequentially by a suitable deposition technique known to those skilled in the art of semiconductor fabrication, for example, but not limited to, CVD, ALD, PVD, PECVD, or the like, or combinations thereof, and are then patterned to partially expose portions of an upper surface of the etch stop layer 15 and to form a plurality of the memory segments 167 and a plurality of the channel segments 158. A first filling material 169 is then filled in the first recesses 163 by a suitable deposition technique known to those skilled in the art of semiconductor fabrication, for example, but not limited to, CVD, PVD, PECVD, or the like. Other suitable techniques for filling the first filling material 169 are within the contemplated scope of the disclosure.

In some embodiments, the memory layer may be made of a high-k dielectric material. In some embodiments, the memory layer may include, for example, but not limited to, a ferroelectric material, silicon nitride, silicon oxynitride, silicon oxide, or the like. The ferroelectric material may be binary oxides such as hafnium oxide (hafnia, $HfO_2$), ternary oxides such as hafnium silicate ($HfSiO_x$), hafnium zirconate ($HfZrO_x$), barium titanate ($BaTiO_3$), lead titanate ($PbTiO_3$), strontium titanate ($SrTiO_3$), calcium manganite ($CaMnO_3$), bismuth ferrite ($BiFeO_3$), aluminum scandium nitride (AlScN), aluminum gallium nitride (AlGaN), aluminum yttrium nitride (AlYN), or the like, or quaternary oxides such as barium strontium titanate ($BaSrTiO_x$), or the like, or combinations thereof. In some embodiments, the memory layer may have a multi-layered structure. Other suitable materials for the memory layer are within the contemplated scope of the disclosure.

In some embodiments, the channel layer may be made of various semiconductor material. In some embodiments, the material for making the channel layer may include, for example, but not limited to, polysilicon, an indium-comprising material, such as $In_{x1}Ga_{x2}Zn_{x3}M_{x4}O$, where M may be Ti, Al, Ag, Si, Sn, W, or the like, and x1, x2, x3 and x4 may each be any value between 0 and 1, or the like, or combinations thereof. In some embodiments, the channel layer may be formed as a single layer having one of the aforesaid materials. In some alternative embodiments, the channel layer may be formed as a laminate structure having at least two of the aforesaid materials in various constitutions. In some embodiments, the channel layer may be doped with a dopant to achieve extra stability. Other suitable materials for the channel layer are within the contemplated scope of the disclosure.

In some embodiments, the first filling material 169 may be, for example, but not limited to, silicon nitride, silicon oxide, silicon oxynitride, or the like.

Referring to FIG. 7B, the method 200 then proceeds to block 212, where a plurality of second recesses are formed in the dielectric stack regions. Referring to the examples illustrated in FIGS. 18 and 19, the dielectric stack regions 164 are recessed by an anisotropic etching process to form a plurality of second recesses 170, each of which is defined by two dielectric stack sub-regions 171 of a corresponding one of the dielectric stack regions 164.

Referring to FIG. 7B, the method 200 then proceeds to block 213, where remainder of the first dielectric layers are removed. Referring to the examples illustrated in FIGS. 19 and 20, remainder of the first dielectric layers 161 are removed by an isotropic etching process based on a relatively high etching selectivity of the first dielectric layers 161 with respect to the second dielectric layers 162.

Referring to FIG. 7B, the method 200 then proceeds to block 214, where a plurality of second conductive regions are formed. Referring to the examples illustrated in FIGS. 20 and 21, a conductive material is filled in the second recesses 170, and then a planarization (for example, but not limited to, CMP) is conducted to remove excess of the conductive material above the dielectric stack sub-regions 171, followed by etching back the conductive material filled in the second recesses 170 by an anisotropic etching process to form a plurality of second conductive regions 166, which integrate with the first conductive regions 165 so as to form a plurality of the conductive films 121, respectively. In some embodiments, in which a glue layer (not shown) is conformally deposited on the dielectric stack regions 164 before the conductive material for forming the first conductive regions 165 is filled in the first recesses 163, a glue portion (not shown) is sandwiched by each of the first conductive regions 165 and a corresponding one of the second conductive regions 166 so as to bond the first and second conductive regions 165, 166, respectively. The conductive material for forming the second conductive regions 166 may be the same as or similar to that for forming the first conductive regions 165.

Referring to FIG. 7B, the method 200 then proceeds to block 215, where a plurality of the memory segments and a plurality of the channel segments are further formed. Referring to the examples illustrated in FIGS. 21 and 22, a plurality of the memory segments 167 and a plurality of the channel segments 168 are further formed. A second filling material 172 is then filled in the second recesses 170. The formations and the materials of the memory segments 167 and the channel segments 168 are the same as or similar to those of the memory segments 167 and the channel segments 168 described above with reference to FIG. 18, and thus details thereof are omitted for the sake of brevity. Similarly, the filling technique and the material of the second filling material 172 are the same as or similar to those of the first filling material 169 described above with reference to FIG. 18, and thus details thereof are omitted for the sake of brevity.

Figure 22:
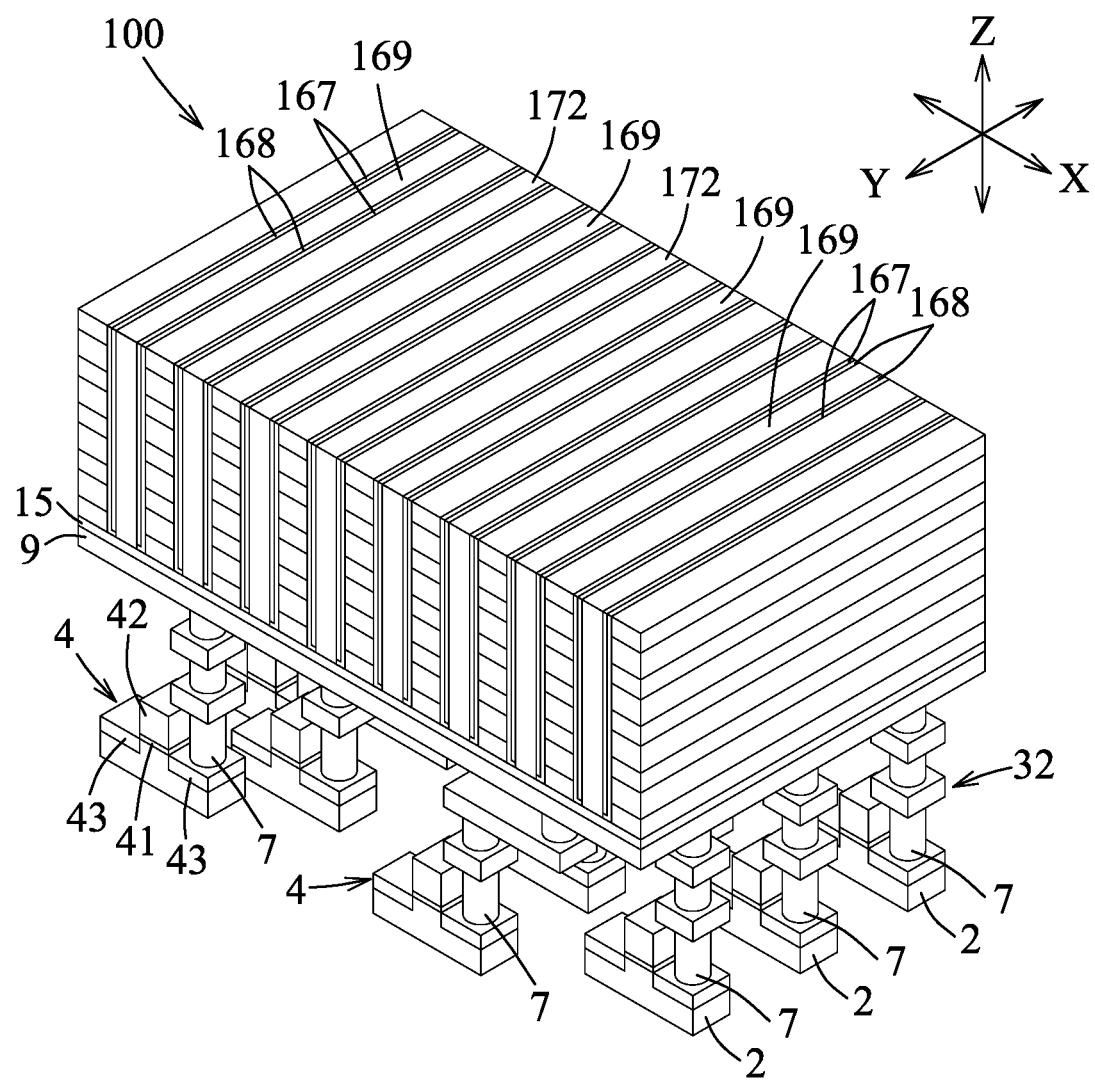
Figure 23:
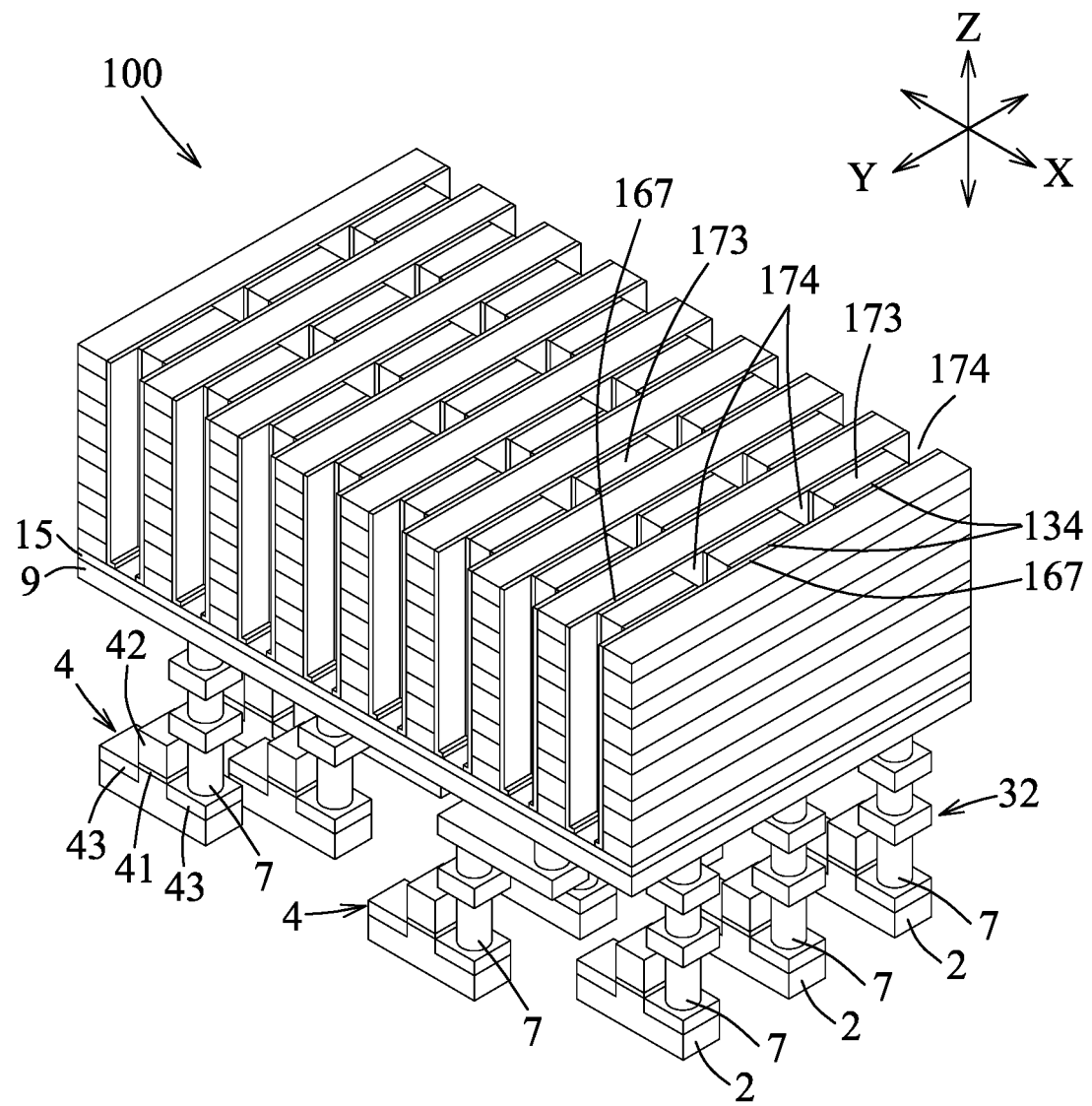
Figure 24:
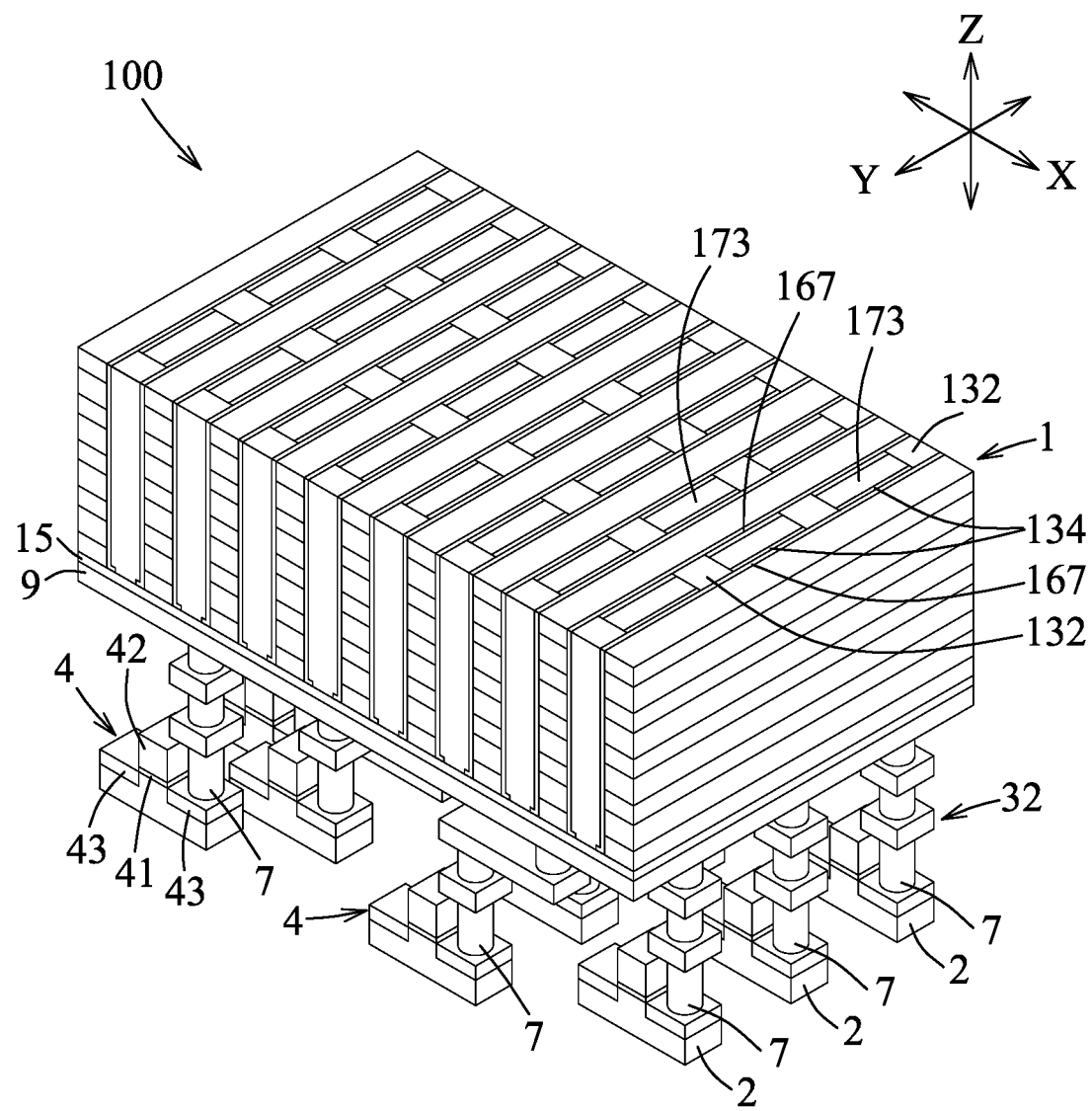
Figure 25:
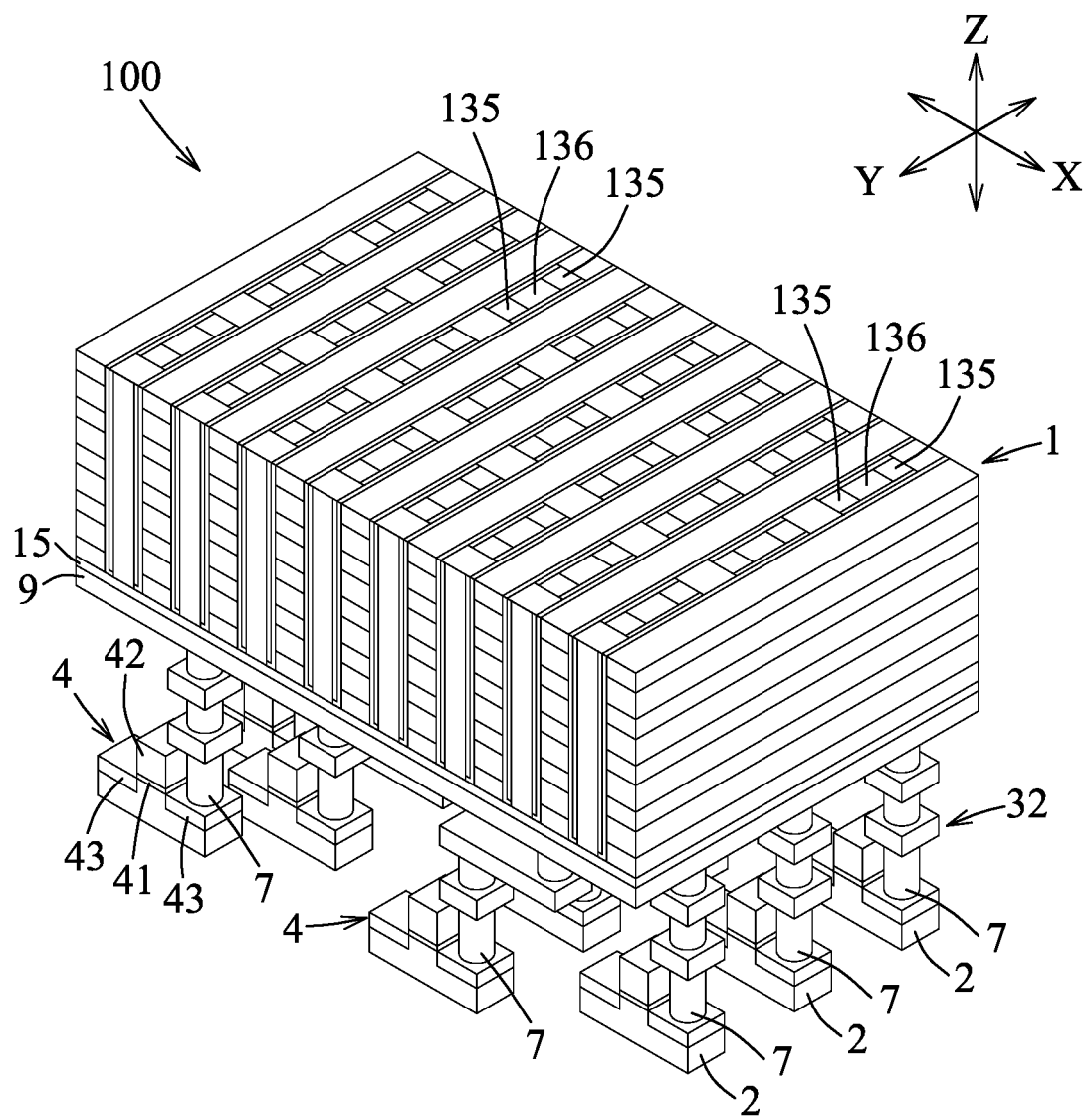
Figure 26:
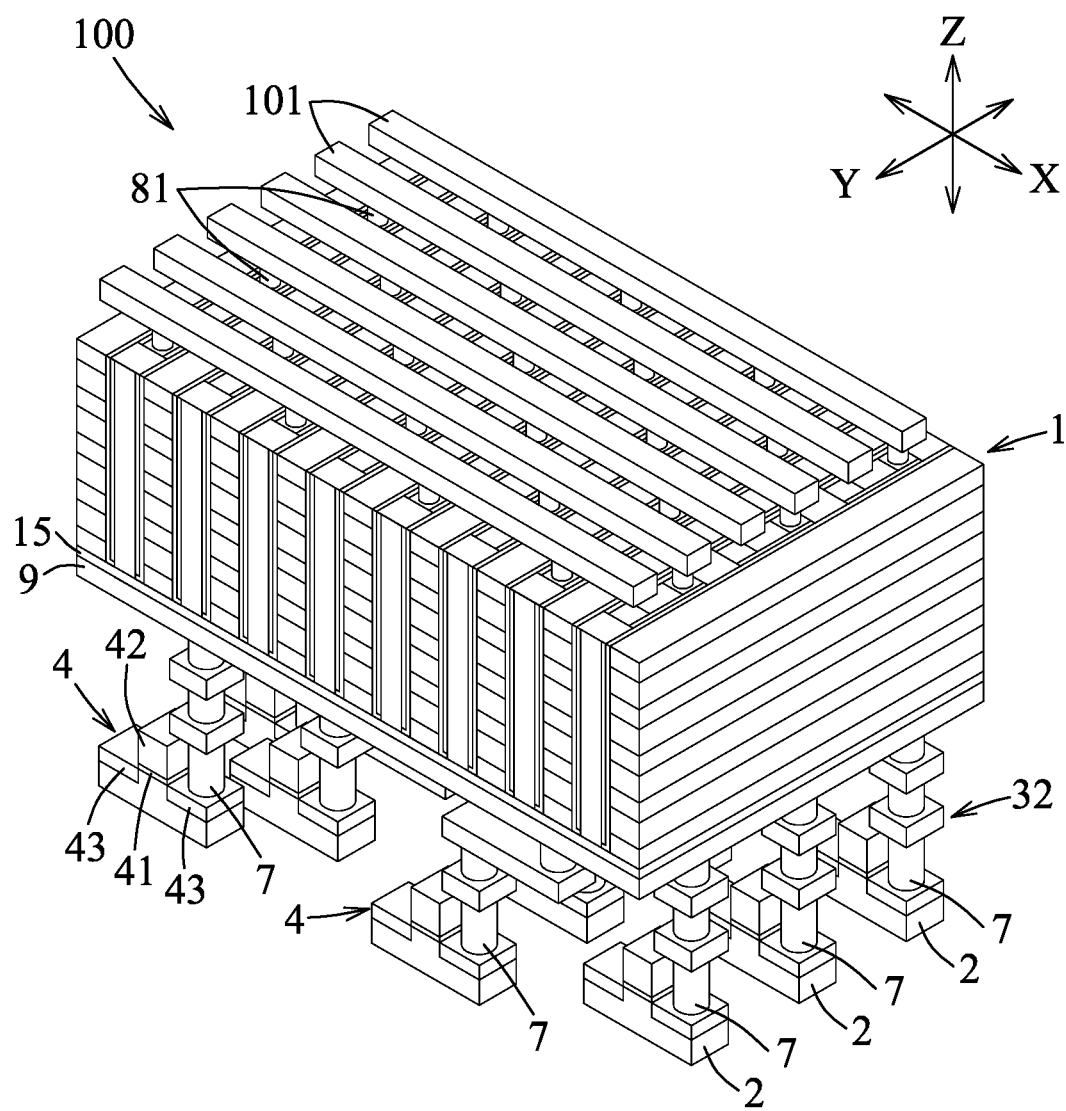

Referring to FIG. 7B, the method 200 then proceeds to block 216, where a plurality of channel portions are formed. Referring to the examples illustrated in FIGS. 22, 23, and 24, the channel segments 168, the first filling material 169, and the second filling material 172 shown in FIG. 22 are patterned to form into a plurality of the channel portions 134 and a plurality of filling portions 173 and to partially expose the memory segments 167 so as to define a plurality of recesses 174, as shown in FIG. 23. Adjacent two of the channel portions 134 are spaced apart from each other, and adjacent two of the filling portions 173 are spaced apart from each other by a corresponding one of the recesses 174 in the Y direction. The channel segments 168, the first filling material 169, and the second filling material 172 may be patterned by a suitable etching technique known to those skilled in the art of semiconductor fabrication, for example, but not limited to, dry etching, reactive-ion etching (RIE), or the like. Other suitable techniques for patterning the channel segments 168, the first filling material 169, and the second filling material 172 are within the contemplated scope of the disclosure. A dielectric material is filled in the recesses 174 to form a plurality of the separators 132, as shown in FIG. 24.

Referring to FIG. 7B, the method 200 then proceeds to block 217, where a plurality of conductive pillars and a plurality of isolation portions are formed. Referring to the examples illustrated in FIGS. 24 and 25, the filling portions 173 are patterned so as to form each of the filling portions 173 into one of the isolation portions 136 and two recesses (not shown) isolated from each other by a corresponding one of the isolation portions 136. A conductive material is then filled in the recesses, followed by conducting a planarization (for example, but not limited to, CMP) to remove excess of the conductive material above the isolation portions 136 so as to form the conductive pillars 135.

Referring to FIG. 7B, the method 200 then proceeds to block 218, where a plurality of top via contacts are formed in a top IMD layer, and block 219, where a plurality of top metal lines are formed. Referring to the example illustrated in FIG. 26, a plurality of top via contacts (i.e., the first via contacts 81) are formed in a top IMD layer (i.e., the first IMD layer 8), and a plurality of top metal lines (i.e., the first conductive lines 101) are formed in the first metal layer 10. The formation and the material of the first via contacts 81 are the same as or similar to those of the second via contacts 91 described above with reference to FIGS. 11 and 12, and the formation and the material of the first conductive lines 101 are the same as or similar to those of the second conductive lines 141 described above with reference to FIG. 9, and thus details thereof are omitted for the sake of brevity.

Figure 27:
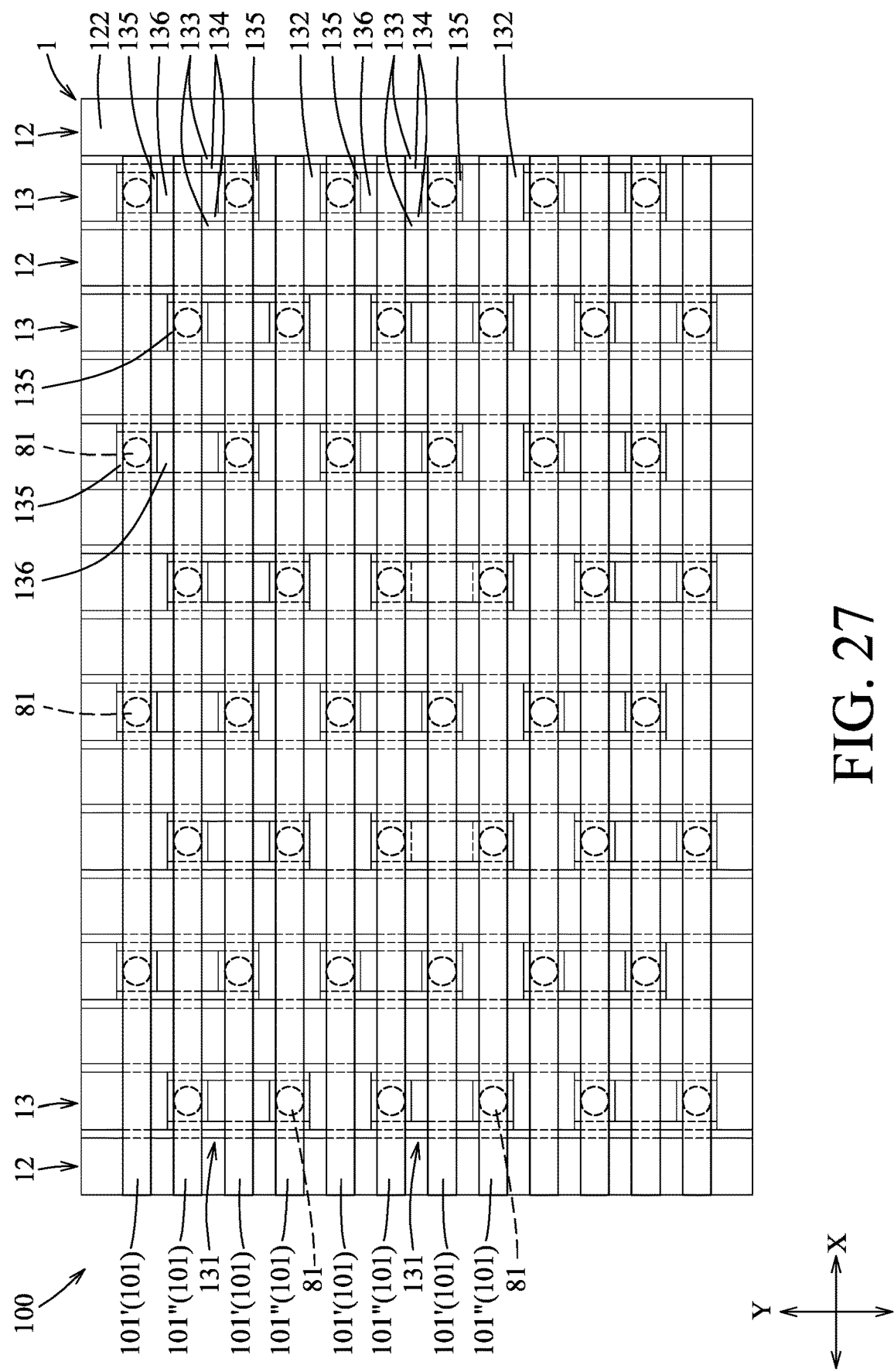
FIG. 27 is a top view of a semiconductor device in accordance with some embodiments.

Referring to FIG. 27, in some embodiments, the conductive pillars 135 are arranged in a plurality of columns spaced apart from each other in the first lengthwise direction (i.e., the X direction), and the conductive pillars 135 in each of the columns are spaced apart from each other in the Y direction and are staggered from the conductive pillars 135 in an adjacent one of the columns. The first conductive lines 101 (i.e., the top metal lines) are divided into a first group of the first conductive lines 101' and a second group of the first conductive lines 101". The first conductive lines 101' in the first group serve as the global source lines and the first conductive lines 101" in the second group serve as the global bit lines. In some embodiments, the first group of the first conductive lines 101' are disposed to alternate with the second group of the first conductive lines 101". Each of the first group of the first conductive lines 101' is electrically connected to a corresponding one of the active structures 4 serving as the source line drivers through a corresponding one of the first via contacts 81, a corresponding one of the conductive pillars 135 serving as the deep vias, a corresponding one of the second via contacts 91, and a corresponding one of the interconnect structures 32, as shown in FIG. 3. Each of the second group of the first conductive lines 101" is electrically connected to a corresponding one of the active structures 4 serving as the bit line drivers through a corresponding one of the first via contacts 81, a corresponding one of the conductive pillars 135 serving as the deep vias, a corresponding one of the second via contacts 91, and a corresponding one of the interconnect structures 32, as shown in FIG. 3. Therefore, the second conductive lines 141 (i.e., the bottom metal lines) described above and shown in FIGS. 3 and 4 are not required in the embodiments illustrated in FIG. 27. In some embodiments, as illustrated in FIG. 27, a tight pitch top metal line/top via process is used.

Referring to FIG. 28, in some embodiments, all of the first conductive lines 101 (i.e., the top metal lines) may serve as the global bit lines, and each of the global bit lines is electrically connected to a corresponding one of the active structures 4 serving as the bit line drivers through a corresponding one of the first via contacts 81, a corresponding one of the conductive pillars 135 serving as the deep vias, a corresponding one of the second via contacts 91, a corresponding one of the interconnect structures 32, and a corresponding one of the source/drain contacts 7 shown in FIGS. 3 and 4; and all of the second conductive lines 141 (i.e., the bottom metal lines) serve as the global source lines, and each of the global source lines is electrically connected to a corresponding one of the active structures 4 serving as the source line drivers through a corresponding one of the interconnect structures 32 and a corresponding one of the source/drain contacts 7 shown in FIGS. 3 and 4. Each of the source line drivers includes a programming driver, and each of the bit line drivers includes a programming driver and a sensing amplifier.

In some embodiments, in which all of the global source lines are disposed above the memory structure 1 and all of the global bit lines are disposed below the memory structure 1, as illustrated in FIGS. 1 to 4, and in some embodiments, in which all of the global bit lines are disposed above the memory structure 1 and all of the global source lines are disposed below the memory structure 1, as illustrated in FIG. 28, the semiconductor device 100 may have a high speed operation, a low global source line/bit line resistance, and a low global source line/bit line capacitance, and thus, a loose pitch top metal line/top via process is used. Coupled noise may be generated in these embodiments.

Figure 29:
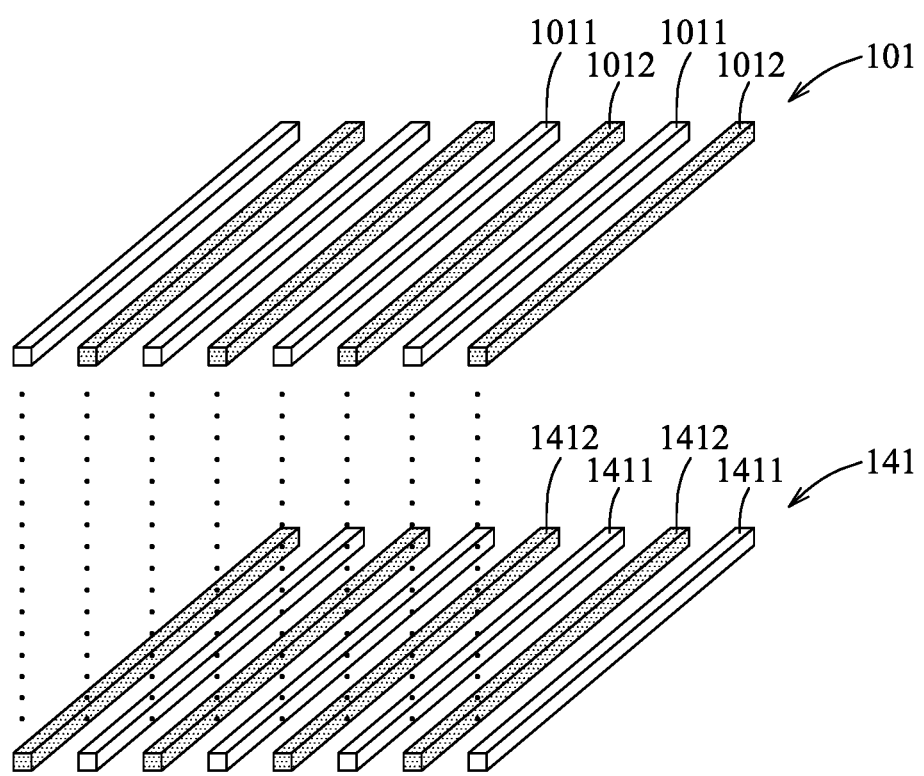
FIGS. 29 to 31 are schematic perspective views illustrating various arrangements of global source lines and global bit lines of a semiconductor device in accordance with some embodiments.

Referring to FIG. 29, in some embodiments, the first conductive lines 101 are divided into a first group of the first conductive lines 1011 and a second group of the first conductive lines 1012. The first conductive lines 1011 in the first group serve as the global source lines, each of which is electrically connected to a corresponding one of the active structures 4 serving as the source line drivers through a corresponding one of the conductive pillars 135 serving as the deep vias. The first conductive lines 1012 in the second group serve as the global bit lines, each of which is electrically connected to a corresponding one of the active structures 4 serving as the bit line drivers through a corresponding one of the conductive pillars 135 serving as the deep vias. The second conductive lines 141 are divided into a first group of the second conductive lines 1411 and a second group of the second conductive lines 1412. The second conductive lines 1411 in the first group serve as the global source lines, each of which is electrically connected to a corresponding one of the active structures 4 serving as the source line drivers through a corresponding one of the interconnect structures 32 shown in FIGS. 3 and 4. The second conductive lines 1412 in the second group serve as the global bit lines, each of which is electrically connected to a corresponding one of the active structures 4 serving as the bit line drivers through a corresponding one of the interconnect structures 32 shown in FIGS. 3 and 4. The first conductive lines 1011 of the first group are disposed to alternate with the first conductive lines 1012 of the second group, and the second conductive lines 1411 of the first group are disposed to alternate with the second conductive lines 1412 of the second group.

Figure 30:
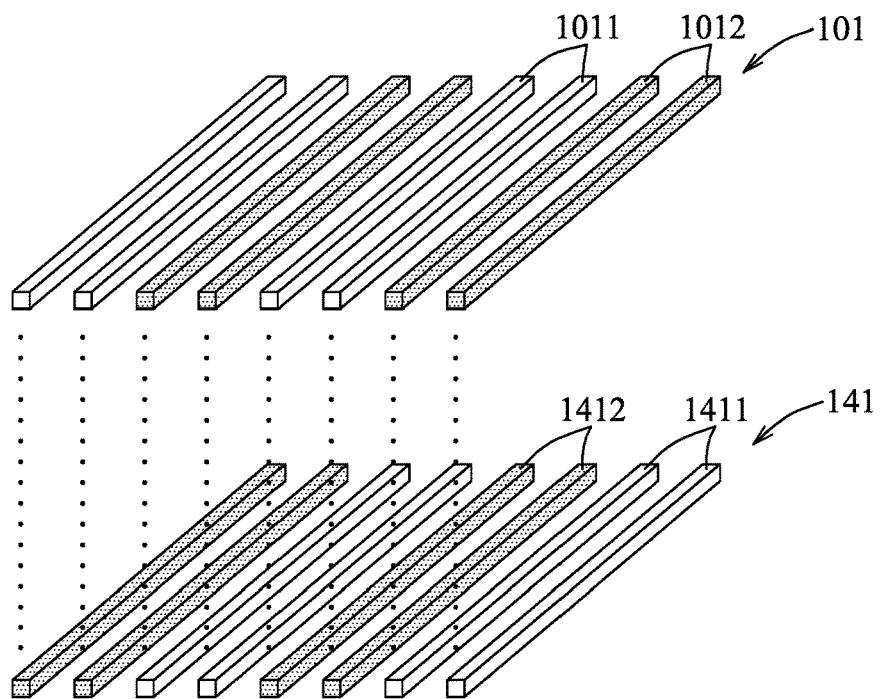
Figure 31:
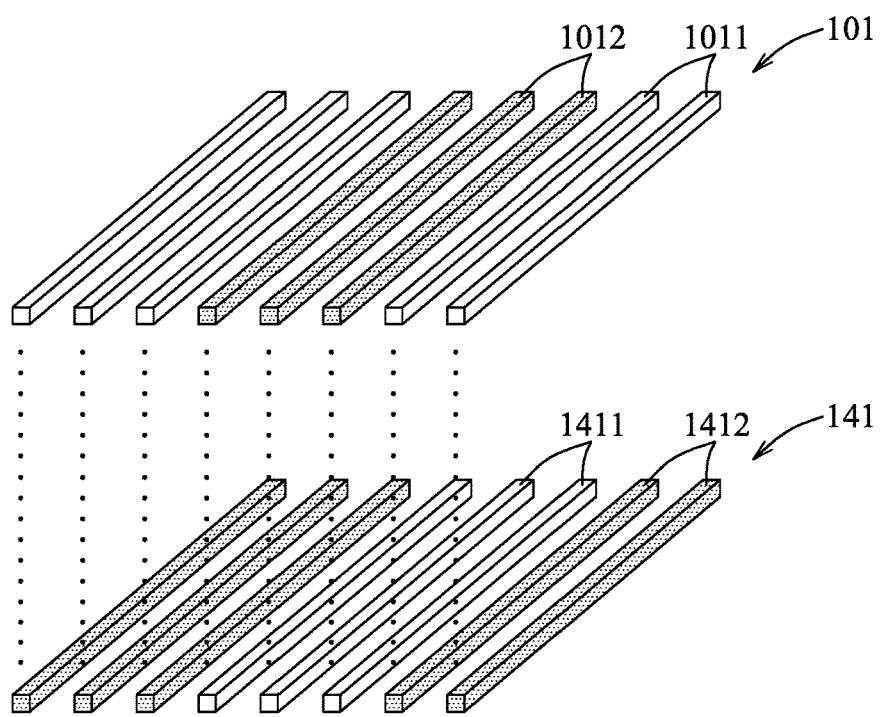

Referring to FIGS. 30 and 31, the embodiments illustrated in FIGS. 30 and 31 are similar to those illustrated in FIG. 29 except for the following differences. The first group of the first conductive lines 1011 serving as the global source lines is divided into a plurality of sub-groups of the first conductive lines 1011. Each of the sub-groups of the first group of the first conductive lines 1011 includes at least two (for example, 2 or 3, as illustrated in FIGS. 30 and 31, respectively) of the first conductive lines 1011. The second group of the first conductive lines 1012 serving as the global bit lines is divided into a plurality of sub-groups of the first conductive lines 1012. Each of the sub-groups of the second group of the first conductive lines 1012 includes at least two (for example, 2 or 3, as illustrated in FIGS. 30 and 31, respectively) of the first conductive lines 1012. The sub-groups of the first group of the first conductive lines 1011 are disposed to alternate with the sub-groups of the second group of the first conductive lines 1012. The first group of the second conductive lines 1411 serving as the global source lines is divided into a plurality of sub-groups of the second conductive lines 1411. Each of the sub-groups of the first group of the second conductive lines 1411 includes at least two (for example, 2 or 3, as illustrated in FIGS. 30 and 31, respectively) of the second conductive lines 1411. The second group of the second conductive lines 1412 serving as the global bit lines is divided into a plurality of sub-groups of the second conductive lines 1412. Each of the sub-groups of the second group of the second conductive lines 1412 includes at least two (for example, 2 or 3, as illustrated in FIGS. 30 and 31, respectively) of the second conductive lines 1412. The sub-groups of the first group of the second conductive lines 1411 are disposed to alternate with the sub-groups of the second group of the second conductive lines 1412. In certain embodiments, as illustrated in FIGS. 29 to 31, a shielding effect may be generated.

Figure 33:
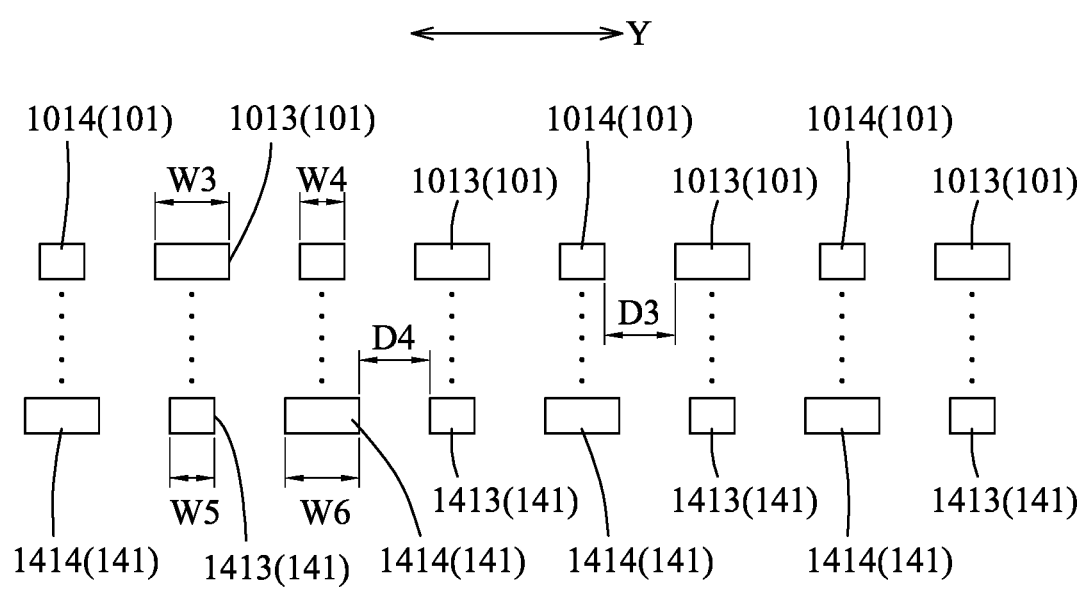

Referring to FIG. 33, in some embodiments, the first conductive lines 101 are spaced apart from each other by a same third distance (D3) in the first spacing direction (i.e., the Y direction), and are divided into a first group of the first conductive lines 1013 and a second group of the first conductive lines 1014 disposed to alternate with the first group of the first conductive lines 1013. The first group of the first conductive lines 1013 has a third width (W3) different from a fourth width (W4) of the second group of the first conductive lines 1014 in the first spacing direction. The second conductive lines 141 are spaced apart from each other by a same fourth distance (D4) in the second spacing direction (i.e., the Y direction), and are divided into a first group of the second conductive lines 1413 and a second group of the second conductive lines 1414 disposed to alternate with the first group of the second conductive lines 1413. The first group of the second conductive lines 1413 has a fifth width (W5) different from a sixth width (W6) of the second group of the second conductive lines 1414 in the second spacing direction. In some embodiments, the third distance (D3) is the same as the fourth distance (D4). In some embodiments, the third width (W3) is the same as the sixth width (W6). In some embodiments, the fourth width (W4) is the same as the fifth width (W5). The first and second conductive lines 101, 104 having a relatively large width may have a relatively low resistance for a critical signal (for example, for a bit line). The first and second conductive lines 101, 104 having a relatively small width may have a relatively low shielding effect.

Figure 34:
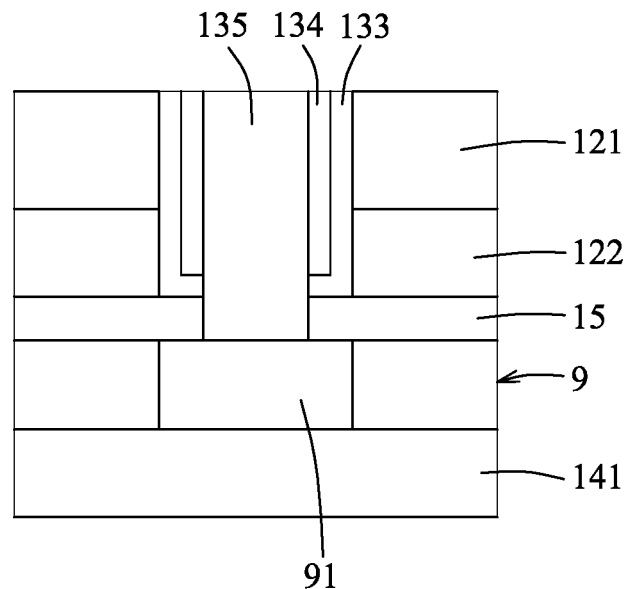
FIGS. 34 to 39 are schematic views illustrating various configurations for electrically connecting a conductive pillar to a bottom metal line of a semiconductor device in accordance with some embodiments.
Figure 35:
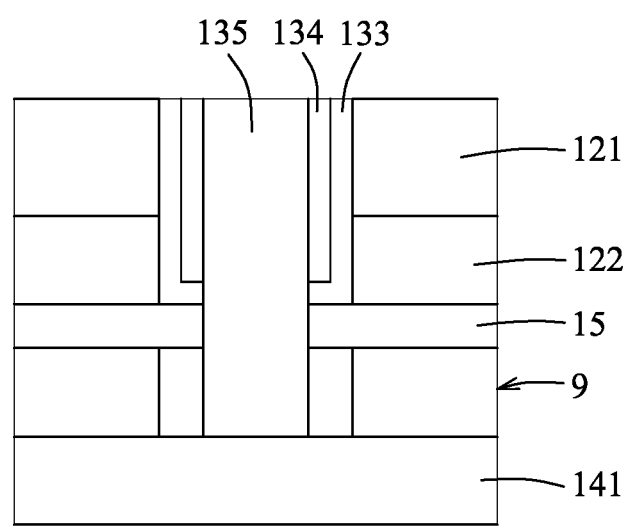
Figure 36:
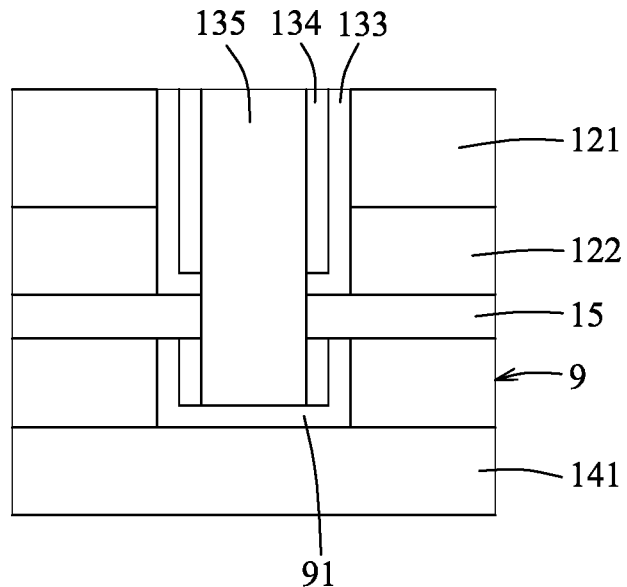
Figure 37:
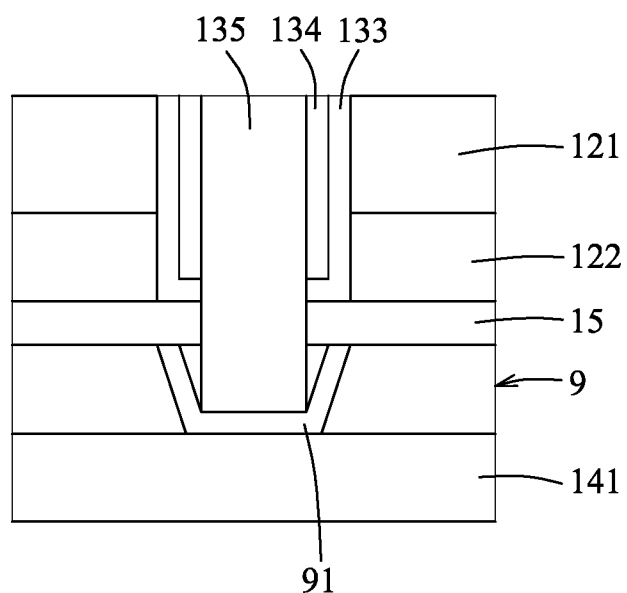
Figure 38:
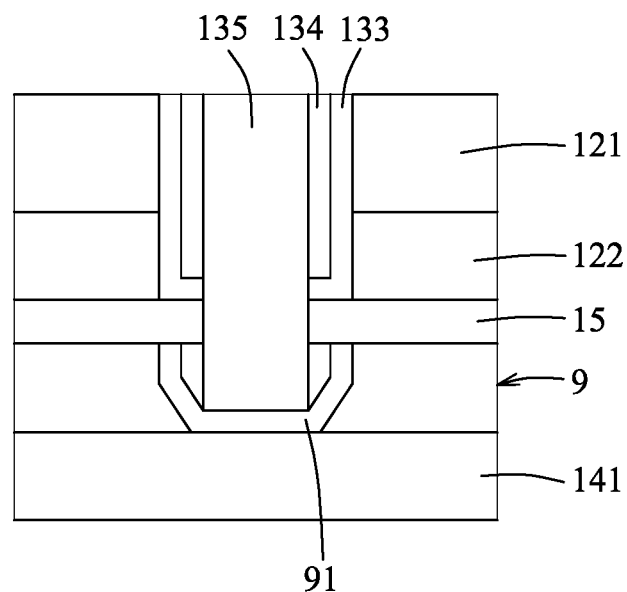
Figure 39:
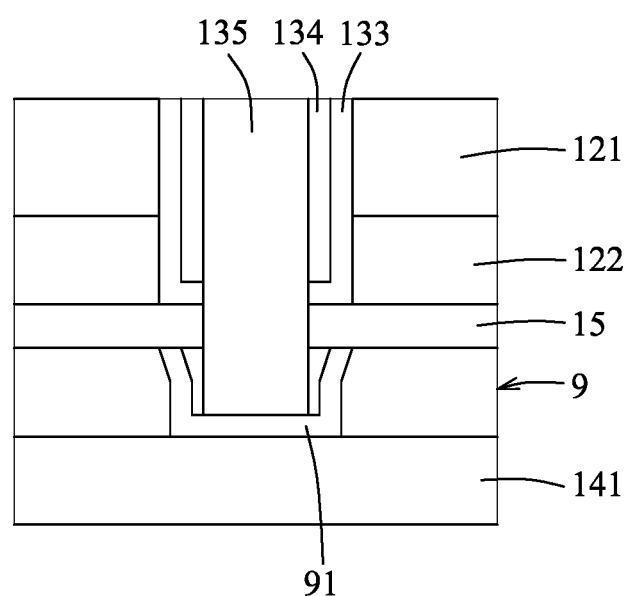

FIGS. 34 to 39 are schematic views illustrating various configurations for electrically connecting the conductive pillar 135 to the bottom metal line (i.e., the second conductive line 141) of the semiconductor device 100 in accordance with some embodiments. In some embodiments, as illustrated in FIG. 34, the conductive pillar 135 is electrically connected to the second conductive line 141 through the second via contact 91 which is configured as a rectangular block. In some embodiments, as illustrated in FIG. 35, the conductive pillar 135 is in direct contact with the second conductive line 141. In some embodiments, as illustrated in FIG. 36, the conductive pillar 135 is electrically connected to the second conductive line 141 through the second via contact 91 which is configured to include a base portion and a vertical wall portion extending upwardly from a periphery of the base portion. In some embodiments, as illustrated in FIG. 37, the conductive pillar 135 is electrically connected to the second conductive line 141 through the second via contact 91 which is configured to include a base portion and an oblique wall portion extending upwardly and obliquely from a periphery of the base portion. In some embodiments, as illustrated in FIG. 38, the conductive pillar 135 is electrically connected to the second conductive line 141 through the second via contact 91 which is configured to include a base portion and a wall portion. The wall portion includes a lower wall part extending upwardly and obliquely from a periphery of the base portion, and an upper wall part extending vertically from the lower wall part. In some embodiments, as illustrated in FIG. 39, the conductive pillar 135 is electrically connected to the second conductive line 141 through the second via contact 91 which is configured to include a base portion and a wall portion. The wall portion includes a lower wall part extending vertically from a periphery of the base portion, and an upper wall part extending upwardly and obliquely from the lower wall part.

In the semiconductor device of the present disclosure, at least one of the conductive pillars formed in the memory structure serves as the deep via (i.e., the dummy source or bit line) to permit at least one of the first conductive lines (i.e., the top metal lines) to be electrically connected to at least one of the active structures disposed below the memory structure therethrough, respectively. Therefore, an additional processing stage is not required to form external interconnect structures outside the memory structure for electrically connecting the top metal lines to the active structures, and thus, the semiconductor device can be further scaled down and the manufacturing method thereof can be simplified.

In accordance with some embodiments of the present disclosure, a semiconductor device includes a substrate, an active structure, a memory structure, and a first conductive line. The active structure is disposed on the substrate. The memory structure is disposed over the active structure, and has a lower surface and an upper surface opposite to each other. The memory structure includes a deep via disposed in the memory structure, and extends in an upward direction from the lower surface to terminate at the upper surface. The first conductive line is disposed above the upper surface of the memory structure, and extends in a first lengthwise direction transverse to the upward direction. The first conductive line is electrically connected to the active structure through the deep via.

In accordance with some embodiments of the present disclosure, the semiconductor device further includes a second conductive line and an interconnect structure. The second conductive line is disposed below the lower surface of the memory structure, and extends in a second lengthwise direction transverse to the upward direction. The interconnect structure is disposed between the second conductive line and the active structure in the upright direction. The semiconductor device includes a plurality of the active structures spaced apart from each other. The first conductive line is electrically connected to a corresponding one of the active structures through the deep via. The second conductive line is electrically connected to a corresponding one of the active structures through the interconnect structure.

In accordance with some embodiments of the present disclosure, the first conductive line serves as a global source line which is electrically connected to the corresponding one of the active structures serving as a source line driver through the deep via. The second conductive line serves as a global bit line which is electrically connected to the corresponding one of the active structures serving as a bit line driver through the interconnect structure.

In accordance with some embodiments of the present disclosure, the first conductive line serves as a global bit line which is electrically connected to the corresponding one of the active structures serving as a bit line driver through the deep via. The second conductive line serves as a global source line which is electrically connected to the corresponding one of the active structures serving as a source line driver through the interconnect structure.

In accordance with some embodiments of the present disclosure, the semiconductor device includes a plurality of the first conductive lines, a plurality of the second conductive lines, a plurality of the deep vias, and a plurality of the interconnect structures. The first conductive lines are divided into a first group of the first conductive lines and a second group of the first conductive lines. The first conductive lines in the first group serve as global source lines, each of which is electrically connected to a corresponding one of the active structures serving as source line drivers through a corresponding one of the deep vias. The first conductive lines in the second group serve as global bit lines, each of which is electrically connected to a corresponding one of the active structures serving as bit line drivers through a corresponding one of the deep vias. The second conductive lines are divided into a first group of the second conductive lines and a second group of the second conductive lines. The second conductive lines in the first group serve as global source lines, each of which is electrically connected to a corresponding one of the active structures serving as source line drivers through a corresponding one of the interconnect structures. The second conductive lines in the second group serve as global bit lines, each of which is electrically connected to a corresponding one of the active structures serving as bit line drivers through a corresponding one of the interconnect structures.

In accordance with some embodiments of the present disclosure, the first conductive lines of the first group of the first conductive lines are disposed to alternate with the first conductive lines of the second group of the first conductive lines, and the second conductive lines of the first group of the second conductive lines are disposed to alternate with the second conductive lines of the second group of the second conductive lines.

In accordance with some embodiments of the present disclosure, the first group of the first conductive lines is divided into a plurality of sub-groups of the first conductive lines. Each of the sub-groups of the first group of the first conductive lines includes at least two of the first conductive lines. The second group of the first conductive lines is divided into a plurality of sub-groups of the first conductive lines. Each of the sub-groups of the second group of the first conductive lines includes at least two of the first conductive lines. The sub-groups of the first group of the first conductive lines are disposed to alternate with the sub-groups of the second group of the first conductive lines.

In accordance with some embodiments of the present disclosure, the first group of the second conductive lines is divided into a plurality of sub-groups of the second conductive lines. Each of the sub-groups of the first group of the second conductive lines includes at least two of the second conductive lines. The second group of the second conductive lines is divided into a plurality of sub-groups of the second conductive lines. Each of the sub-groups of the second group of the second conductive lines includes at least two of the second conductive lines. The sub-groups of the first group of the second conductive lines are disposed to alternate with the sub-groups of the second group of the second conductive lines.

In accordance with some embodiments of the present disclosure, the semiconductor device includes a plurality of the deep vias, a plurality of the interconnect structures, a plurality of the first conductive lines, and a plurality of the second conductive lines. Each of the first conductive lines is electrically connected to a corresponding one of the active structures through a corresponding one of the deep vias. Each of the second conductive lines is electrically connected to a corresponding one of the active structures through a corresponding one of the interconnect structures. The first conductive lines are spaced apart from each other in a first spacing direction transverse to the first lengthwise direction and the upward direction by a same distance, and have a same width in the first spacing direction. The second conductive lines are spaced apart from each other in a second spacing direction transverse to the second lengthwise direction and the upward direction by a same distance, and have a same width in the second spacing direction.

In accordance with some embodiments of the present disclosure, the semiconductor device includes a plurality of the deep vias, a plurality of the interconnect structures, a plurality of the first conductive lines, and a plurality of the second conductive lines. Each the first conductive lines is electrically connected to a corresponding one of the active structures through a corresponding one of the deep vias. Each of the second conductive lines is electrically connected to a corresponding one of the active structures through a corresponding one of the interconnect structures. The first conductive lines are spaced apart from each other by a same distance in a first spacing direction transverse to the first lengthwise direction and the upward direction, and are divided into a first group of the first conductive lines and a second group of the first conductive lines. The first conductive lines of the first group of the first conductive lines are disposed to alternate with the first conductive lines of the second group of the first conductive lines. The first group of the first conductive lines has a width different from that of the second group of the first conductive lines in the first spacing direction. The second conductive lines are spaced apart from each other by a same distance in a second spacing direction transverse to the second lengthwise direction and the upward direction, and are divided into a first group of the second conductive lines and a second group of the second conductive lines. The second conductive lines of the first group of the second conductive lines are disposed to alternate with the second conductive lines of the second group of the second conductive lines. The first group of the second conductive lines has a width different from that of the second group of the second conductive lines in the second spacing direction.

In accordance with some embodiments of the present disclosure, the semiconductor device includes a plurality of the active structures, a plurality of the deep vias, and a plurality of the first conductive lines. The first conductive lines are divided into a first group of the first conductive lines and a second group of the first conductive lines. The first conductive lines in the first group serve as global source lines and are electrically connected to corresponding ones of the active structures serving as source line drivers through corresponding ones of the deep vias, respectively. The first conductive lines in the second group serve as global bit lines and are electrically connected to corresponding ones of the active structures serving as bit line drivers through corresponding ones of the deep vias, respectively.

In accordance with some embodiments of the present disclosure, a semiconductor device includes a substrate, at least one active structure, a memory structure, and at least one first conductive line. The at least one active structure is disposed on the substrate. The memory structure is disposed over the at least one active structure, and has a lower surface and an upper surface opposite to each other. The memory structure includes a plurality of conductive pillars disposed in the memory structure and extending in an upward direction from the lower surface to terminate at the upper surface. At least one of the conductive pillars serves as a deep via, and each of remaining ones of the conductive pillars serves as a source or bit line. The at least one first conductive line is disposed above the upper surface of the memory structure, and extends in a first lengthwise direction transverse to the upward direction. The at least one first conductive line is electrically connected to the at least one active structure through the at least one of the conductive pillars serving as the deep via, respectively.

In accordance with some embodiments of the present disclosure, the semiconductor device further includes at least one second conductive line and at least one interconnect structure. The at least one second conductive line is disposed below the lower surface of the memory structure, and extends in a second lengthwise direction transverse to the upward direction. The at least one interconnect structure is disposed between the at least one second conductive line and the at least one active structure in the upward direction. The semiconductor device includes a plurality of the active structures spaced apart from each other. Each of the at least one first conductive line is electrically connected to a corresponding one of the active structures through a corresponding one of the at least one of the conductive pillars serving as the deep via. Each of the at least one second conductive line is electrically connected to a corresponding one of the active structures through a corresponding one of the at least one interconnect structure.

In accordance with some embodiments of the present disclosure, the semiconductor device includes a plurality of the first conductive lines spaced apart from each other in a first spacing direction transverse to the upward direction and the first lengthwise direction. The conductive pillars are arranged in a plurality of columns spaced apart from each other in the first lengthwise direction. The conductive pillars in each of the columns are staggered from the conductive pillars in an adjacent one of the columns. The first conductive lines are divided into a first group of the first conductive lines serving as global source lines and a second group of the first conductive lines serving as global bit lines. Each of the first group of the first conductive lines is electrically connected to a corresponding one of the active structures serving as source line drivers through a corresponding one of the conductive pillars serving as the deep vias. Each of the second group of the first conductive lines is electrically connected to a corresponding one of the active structures serving as bit line drivers through a corresponding one of the conductive pillars serving as the deep vias.

In accordance with some embodiments of the present disclosure, the semiconductor device includes a plurality of the first conductive lines spaced apart from each other in a first spacing direction transverse to the upward direction and the first lengthwise direction, and a plurality of the second conductive lines spaced apart from each other in a second spacing direction transverse to the upward direction and the second lengthwise direction. The conductive pillars are arranged in a plurality of columns spaced apart from each other in the first spacing direction. The conductive pillars in each of the columns are aligned with the conductive pillars in an adjacent one of the columns, respectively. Each of the first conductive lines is electrically connected to a corresponding one of the active structures through a corresponding one of the conductive pillars serving as the deep vias. Each of the second conductive lines is electrically connected to a corresponding one of the active structures through a corresponding one of the interconnect structures.

In accordance with some embodiments of the present disclosure, the first conductive lines serve as global source lines and are electrically connected to the active structures serving as source line drivers through corresponding ones of the conductive pillars serving as the deep vias, respectively. The second conductive lines serve as global bit lines and are electrically connected to the active structures serving as bit line drivers through the interconnect structures, respectively.

In accordance with some embodiments of the present disclosure, the first conductive lines serve as global bit lines and are electrically connected to the active structures serving as bit line drivers through corresponding ones of the conductive pillars serving as the deep vias, respectively. The second conductive lines serve as global source lines and are electrically connected to the active structures serving as source line drivers through the interconnect structures, respectively.

In accordance with some embodiments of the present disclosure, a method for manufacturing a semiconductor device includes: forming a semi-product of a memory structure over a substrate formed with at least one active structure disposed on the substrate; forming a trench in the semi-product, the trench extending in an upward direction from a lower surface of the semi-product to terminate at an upper surface of the semi-product; filling a conductive material in the trench to form the memory structure including a conductive pillar serving as a deep via; and forming a first conductive line above the upper surface of the memory structure, the first conductive line extending in a first lengthwise direction transverse to the upward direction and being electrically connected to a corresponding one of the at least one active structure through the conductive pillar serving as the deep via.

In accordance with some embodiments of the present disclosure, the method further includes, prior to forming the semi-product of the memory structure over the substrate: forming an interconnect structure over the at least one active structure; and forming a second conductive line over the interconnect structure so as to permit the memory structure to be disposed over the second conductive line after formation of the memory structure, the second conductive line extending in a second lengthwise direction transverse to the upward direction and being electrically connected to a corresponding one of the at least one active structure through the interconnect structure.

In accordance with some embodiments of the present disclosure, the semi-product of the memory structure is formed with a plurality of the trenches extending in the upward direction and spaced apart from each other. The memory structure is formed with a plurality of the conductive pillars after filling the conductive material in the trenches; at least one of the conductive pillars serving as the deep via, each of remaining ones of the conductive pillars serving as a source or bit line.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate;
at least one active structure disposed on the substrate;
a memory structure disposed over the at least one active structure and having a lower surface and an upper surface opposite to each other, the memory structure including at least one deep via disposed in the memory structure and extending in an upward direction from the lower surface to terminate at the upper surface; and
at least one first conductive line disposed above the upper surface of the memory structure and extending in a first lengthwise direction transverse to the upward direction, the at least one first conductive line being electrically connected to the at least one active structure through the at least one deep via,
wherein
the memory structure includes a plurality of conductive pillars extending in the upward direction and made of a conductive material, at least one of the plurality of conductive pillars serving as the at least one deep via, each of remaining ones of the plurality of conductive pillars serving as a source line or a bit line, the conductive material of the at least one of the plurality of conductive pillars serving as the at least one deep via being the same as the conductive material of the each of the remaining ones of the plurality of conductive pillars serving as the source line or the bit line, and
the memory structure further includes a plurality of conductive films extending in a direction transverse to the upward direction and serving as word lines.

2. The semiconductor device according to claim 1, further comprising:
at least one second conductive line disposed below the lower surface of the memory structure and extending in a second lengthwise direction transverse to the upward direction, and
at least one interconnect structure disposed between the at least one second conductive line and the at least one active structure in the upright direction, wherein
the at least one active structure includes a plurality of active structures spaced apart from each other,
the at least one deep via includes a plurality of deep vias,
the at least one first conductive line includes a plurality of first conductive lines, each of which is electrically connected to a corresponding one of the plurality of active structures through a corresponding one of the plurality of deep vias,
the at least one interconnect structure includes a plurality of interconnect structures, and
the at least one second conductive line includes a plurality of second conductive lines, each of which is electrically connected to a corresponding one of the plurality of active structures through a corresponding one of the plurality of interconnect structures.

3. The semiconductor device according to claim 2, wherein
each of the plurality of first conductive lines serves as a global source line, and is electrically connected to the corresponding one of the plurality of active structures serving as a source line driver through the corresponding one of the plurality of deep vias; and
each of the plurality of second conductive lines serves as a global bit line, and is electrically connected to the corresponding one of the plurality of active structures serving as a bit line driver through the corresponding one of interconnect structures.

4. The semiconductor device according to claim 2, wherein
each of the plurality of first conductive lines serves as a global bit line, and is electrically connected to the corresponding one of the plurality of active structures serving as a bit line driver through the corresponding one of the plurality of deep vias; and
each of the plurality of second conductive lines serves as a global source line, and is electrically connected to the corresponding one of the plurality of active structures serving as a source line driver through the corresponding one of the plurality of interconnect structures.

5. The semiconductor device according to claim 2, wherein
the plurality of first conductive lines are divided into
a first group of the first conductive lines serving as global source lines, each of which is electrically connected to a corresponding one of the plurality of active structures serving as source line drivers through a corresponding one of the plurality of deep vias, and
a second group of the first conductive lines serving as global bit lines, each of which is electrically connected to a corresponding one of the plurality of active structures serving as bit line drivers through a corresponding one of the plurality of deep vias; and
the plurality of second conductive lines are divided into
a first group of the second conductive lines serving as global source lines, each of which is electrically connected to a corresponding one of the plurality of active structures serving as source line drivers through a corresponding one of the plurality of interconnect structures, and
a second group of the second conductive lines serving as global bit lines, each of which is electrically connected to a corresponding one of the plurality of active structures serving as bit line drivers through a corresponding one of the plurality of interconnect structures.

6. The semiconductor device according to claim 5, wherein
the first conductive lines of the first group of the first conductive lines are disposed to alternate with the first conductive lines of the second group of the first conductive lines; and
the second conductive lines of the first group of the second conductive lines are disposed to alternate with the second conductive lines of the second group of the second conductive lines.

7. The semiconductor device according to claim 5, wherein
the first group of the first conductive lines is divided into a plurality of sub-groups of the first conductive lines, each of the sub-groups of the first group of the first conductive lines including at least two of the first conductive lines;

the second group of the first conductive lines is divided into a plurality of sub-groups of the first conductive lines, each of the sub-groups of the second group of the first conductive lines including at least two of the first conductive lines; and the sub-groups of the first group of the first conductive lines are disposed to alternate with the sub-groups of the second group of the first conductive lines.

8. The semiconductor device according to claim 5, wherein the first group of the second conductive lines is divided into a plurality of sub-groups of the second conductive lines, each of the sub-groups of the first group of the second conductive lines including at least two of the second conductive lines;

the second group of the second conductive lines is divided into a plurality of sub-groups of the second conductive lines, each of the sub-groups of the second group of the second conductive lines including at least two of the second conductive lines; and the sub-groups of the first group of the second conductive lines are disposed to alternate with the sub-groups of the second group of the second conductive lines.

9. The semiconductor device according to claim 2, wherein the plurality of first conductive lines are spaced apart from each other in a first spacing direction transverse to the first lengthwise direction and the upward direction by a same distance, and have a same width in the first spacing direction; and the plurality of second conductive lines are spaced apart from each other in a second spacing direction transverse to the second lengthwise direction and the upward direction by a same distance, and have a same width in the second spacing direction.

10. The semiconductor device according to claim 2, wherein the plurality of first conductive lines are spaced apart from each other by a same distance in a first spacing direction transverse to the first lengthwise direction and the upward direction, and are divided into a first group of the first conductive lines and a second group of the first conductive lines, the first conductive lines of the first group of the first conductive lines being disposed to alternate with the first conductive lines of the second group of the first conductive lines, the first group of the first conductive lines having a width different from a width of the second group of the first conductive lines in the first spacing direction; and the plurality of second conductive lines are spaced apart from each other by a same distance in a second spacing direction transverse to the second lengthwise direction and the upward direction, and are divided into a first group of the second conductive lines and a second group of the second conductive lines, the second conductive lines of the first group of the second conductive lines being disposed to alternate with the second conductive lines of the second group of the second conductive lines, the first group of the second conductive lines having a width different from a width of the second group of the second conductive lines in the second spacing direction.

11. The semiconductor device according to claim 1, wherein the at least one active structure includes a plurality of active structures;

the at least one deep via includes a plurality of deep vias; and the at least one first conductive line includes a plurality of first conductive lines, which are divided into a first group of the first conductive lines serving as global source lines which are electrically connected to corresponding ones of the plurality of active structures serving as source line drivers through corresponding ones of the plurality of deep vias, respectively; and a second group of the first conductive lines serving as global bit lines which are electrically connected to corresponding ones of the plurality of active structures serving as bit line drivers through corresponding ones of the plurality of deep vias, respectively.

12. A semiconductor device comprising:

a substrate;

at least one active structure disposed on the substrate;

a memory structure disposed over the at least one active structure and having a lower surface and an upper surface opposite to each other, the memory structure including a plurality of conductive pillars disposed in the memory structure and extending in an upward direction from the lower surface to terminate at the upper surface, at least one of the plurality of conductive pillars serving as a deep via and each of remaining ones of the plurality of conductive pillars serving as a source line or a bit line; and at least one first conductive line disposed above the upper surface of the memory structure and extending in a first lengthwise direction transverse to the upward direction, the at least one first conductive line being electrically connected to the at least one active structure through the at least one of the conductive pillars serving as the deep via, wherein the plurality of conductive pillars are made of a conductive material, the conductive material of the at least one of the plurality of conductive pillars serving as the deep via being the same as the conductive material of the each of the remaining ones of the plurality of conductive pillars serving as the source line or the bit line, and the memory structure further includes:

a plurality of conductive films extending in a direction n transverse to the upward direction and serving as word lines; and a plurality of channel portions extending in the upward direction, each of the plurality of channel portions being disposed between two corresponding ones of the plurality of conductive pillars and corresponding ones of the plurality of conductive films, the two corresponding ones of the plurality of conductive pillars serving as the source line and the bit line, respectively.

13. The semiconductor device according to claim 12, further comprising:

at least one second conductive line disposed below the lower surface of the memory structure and extending in a second lengthwise direction transverse to the upward direction; and at least one interconnect structure disposed between the at least one second conductive line and the at least one active structure in the upward direction, wherein the at least one active structure includes a plurality of active structures spaced apart from each other, each of the at least one first conductive line is electrically connected to a corresponding one of the plurality of active structures through a corresponding one of the at least one of the conductive pillars serving as the deep via, and each of the at least one second conductive line is electrically connected to a corresponding one of the plurality of active structures through a corresponding one of the at least one interconnect structure.

14. The semiconductor device according to claim 12, wherein the at least one first conductive line includes a plurality of first conductive lines spaced apart from each other in a first spacing direction transverse to the upward direction and the first lengthwise direction;

the plurality of conductive pillars are arranged in a plurality of columns spaced apart from each other in the first lengthwise direction, the conductive pillars in each of the plurality of columns being staggered from the conductive pillars in an adjacent one of the plurality of columns;

the plurality of first conductive lines are divided into a first group of the first conductive lines serving as global source lines and a second group of the first conductive lines serving as global bit lines;

each of the first group of the first conductive lines is electrically connected to a corresponding one of the plurality of active structures serving as source line drivers through a corresponding one of the plurality of conductive pillars each serving as the deep via; and each of the second group of the first conductive lines is electrically connected to a corresponding one of the plurality of active structures serving as bit line drivers through a corresponding one of the conductive pillars each serving as the deep via.

15. The semiconductor device according to claim 13, wherein the at least one first conductive line includes a plurality of first conductive lines spaced apart from each other in a first spacing direction transverse to the upward direction and the first lengthwise direction;

the at least one second conductive line includes a plurality of second conductive lines spaced apart from each other in a second spacing direction transverse to the upward direction and the second lengthwise direction;

the at least one interconnect structure includes a plurality of interconnect structures;

the plurality of conductive pillars are arranged in a plurality of columns spaced apart from each other in the first spacing direction, the conductive pillars in each of the plurality of columns being aligned with the conductive pillars in an adjacent one of the plurality of columns, respectively;

each of the plurality of first conductive lines is electrically connected to a corresponding one of the plurality of active structures thorough a corresponding one of the conductive pillars each serving as the deep via; and each of the plurality of second conductive lines is electrically connected to a corresponding one of the plurality of active structures thorough a corresponding one of the plurality of interconnect structures.

16. The semiconductor device according to claim 15, wherein the plurality of first conductive lines serve as global source lines and are electrically connected to the plurality of active structures serving as source line drivers through corresponding ones of the plurality of conductive pillars each serving as the deep via, respectively; and the plurality of second conductive lines serve as global bit lines and are electrically connected to the plurality of active structures serving as bit line drivers through the plurality of interconnect structures, respectively.

17. The semiconductor device according to claim 15, wherein the plurality of first conductive lines serve as global bit lines and are electrically connected to the plurality of active structures serving as bit line drivers through corresponding ones of the plurality of conductive pillars each serving as the deep via, respectively; and the plurality of second conductive lines serve as global source lines and are electrically connected to the plurality of active structures serving as source line drivers through the plurality of interconnect structures, respectively.

18. A semiconductor device comprising:

a substrate;

at least one active structure disposed on the substrate;

a memory structure disposed over the at least one active structure and having a lower surface and an upper surface opposite to each other, the memory structure including at least one deep via disposed in the memory structure and extending in an upward direction from the lower surface to terminate at the upper surface;

at least one first conductive line disposed above the upper surface of the memory structure and extending in a first lengthwise direction transverse to the upward direction, the at least one first conductive line being electrically connected to the at least one active structure through the at least one deep via;

at least one second conductive line disposed below the lower surface of the memory structure and extending in a second lengthwise direction transverse to the upward direction; and at least one via contact disposed between the at least one deep via and the at least one second conductive line, the at least one deep via being electrically connected to the at least one second conductive line through the at least one via contact, respectively, wherein the memory structure includes a plurality of conductive pillars extending in the upward direction and made of a conductive material, at least one of the plurality of conductive pillars serving as the at least one deep via, each of remaining ones of the plurality of conductive pillars serving as a source line or a bit line, the conductive material of the at least one of the plurality of conductive pillars serving as the at least one deep via being the same as the conductive material of the each of the remaining ones of the plurality conductive pill serving as the source line or the bit line, and the memory structure further includes a plurality of channel portions and a plurality of memory portions, each of the plurality of channel portions being disposed between two corresponding ones of plurality of conductive pillars and a corresponding one of the plurality of memory portions, the two or responding ones of the plurality of conductive pillars serving as source line and the bit line, respectively.

19. The semiconductor device according to claim 18, wherein the at least one via contact includes a base portion and a vertical wall portion extending upwardly from a periphery of the base portion.

20. The semiconductor device according to claim 18, wherein the at least one via contact includes a base portion and an oblique wall portion extending upwardly and obliquely from a periphery of the base portion.

* * * * *